(12) United States Patent
Okumura

(10) Patent No.: US 10,777,677 B2
(45) Date of Patent: Sep. 15, 2020

(54) INSULATED GATE SEMICONDUCTOR DEVICE AND METHOD OF MANUFACTURING SAME

(71) Applicant: Fuji Electric Co., Ltd., Kanagawa (JP)

(72) Inventor: Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/546,243

(22) Filed: Aug. 20, 2019

(65) Prior Publication Data

US 2019/0371938 A1 Dec. 5, 2019

Related U.S. Application Data

(62) Division of application No. 15/973,921, filed on May 8, 2018, now Pat. No. 10,483,390.

(30) Foreign Application Priority Data

Jun. 2, 2017 (JP) .................................. 2017-110281

(51) Int. Cl.
| | | |
|---|---|---|
| H01L 29/00 | (2006.01) | |
| H01L 29/78 | (2006.01) | |
| H01L 29/10 | (2006.01) | |
| H01L 29/04 | (2006.01) | |
| H01L 21/04 | (2006.01) | |
| H01L 29/739 | (2006.01) | |

(Continued)

(52) U.S. Cl.
CPC ........ *H01L 29/7813* (2013.01); *H01L 21/047* (2013.01); *H01L 21/0465* (2013.01); *H01L 29/045* (2013.01); *H01L 29/0623* (2013.01); *H01L 29/0688* (2013.01); *H01L 29/1045* (2013.01); *H01L 29/1079* (2013.01); *H01L 29/1095* (2013.01); *H01L 29/1608* (2013.01); *H01L 29/42304* (2013.01); *H01L 29/66068* (2013.01); *H01L 29/7397* (2013.01)

(58) Field of Classification Search
CPC .......................... H01L 21/047; H01L 29/1608
See application file for complete search history.

(56) References Cited

U.S. PATENT DOCUMENTS 6,342,709 B1 * 1/2002 Sugawara ........... H01L 29/0619
257/139
8,598,652 B2 12/2013 Takaya (Continued)

FOREIGN PATENT DOCUMENTS

| JP | 2013-219161 A | 10/2013 |
| JP | 2014-49620 A | 3/2014 |
| JP | 2015-216182 A | 12/2015 |

*Primary Examiner* — Caridad Everhart
*Assistant Examiner* — Ankush K Singal
(74) *Attorney, Agent, or Firm* — Chen Yoshimura LLP

(57) ABSTRACT

An insulated gate semiconductor device includes $p^+$ gate bottom protection regions embedded in a drift layer at the bottoms of trenches that goes through $n^+$ source regions and p-type base regions, and $p^+$ base bottom embedded regions embedded in the drift layer below the base regions. The base bottom embedded regions have trapezoidal shapes due to a channeling phenomenon, and the bottom surfaces of the base bottom embedded regions are deeper than the bottom surfaces of the gate bottom protection regions.

10 Claims, 27 Drawing Sheets

(51) Int. Cl.
    *H01L 29/423*     (2006.01)
    *H01L 29/16*     (2006.01)
    *H01L 29/66*     (2006.01)
    *H01L 29/06*     (2006.01)

(56) References Cited

U.S. PATENT DOCUMENTS

| | | |
|---|---|---|
| 2008/0230787 A1 | 9/2008 | Suzuki et al. |
| 2011/0233728 A1 | 9/2011 | Chiola et al. |
| 2017/0110571 A1 | 4/2017 | Kobayashi et al. |
| 2017/0141223 A1 | 5/2017 | Hoshi |
| 2017/0221714 A1* | 8/2017 | Wakimoto .......... H01L 29/1095 |
| 2018/0182886 A1 | 6/2018 | Kobayashi et al. |
| 2019/0097030 A1 | 3/2019 | Miyata et al. |

\* cited by examiner

◉ : Si
○ : C

◉ : Si
○ : C

INSULATED GATE SEMICONDUCTOR DEVICE AND METHOD OF MANUFACTURING SAME

BACKGROUND OF THE INVENTION

Technical Field

The present invention relates to an insulated gate semiconductor device and a method of manufacturing the same, and particularly relates to an insulated gate semiconductor device having a trench gate structure and a method of manufacturing the same.

Background Art

A trench gate MOS field effect transistor (MOSFET) can be expected to reduce ON resistance due to narrowing the pitch of cells as compared to planar structures. However, in an insulated gate semiconductor device such as a SiC-MOSFET device that uses silicon carbide (SiC), there is a risk that the gate insulating film at the bottom of the trench will be destroyed by high voltages during reverse bias when attempting to make use of the high breakdown electric field strength of SiC.

Attempts have begun to try ion implantation (channeling ion implantation) that uses the phenomenon of channeling in the manufacturing of insulated gate semiconductor devices having SiC (see Patent Documents 1 to 3). However, in the inventions disclosed in Patent Documents 1 to 3, there has been no examination into using channeling ion implantation to solve problems that are unique to trench gate structures.

RELATED ART DOCUMENTS

Patent Documents

Patent Document 1: Japanese Patent Application Laid-Open Publication No. 2015-216182
Patent Document 2: Japanese Patent Application Laid-Open Publication No. 2013-219161
Patent Document 3: Japanese Patent Application Laid-Open Publication No. 2014-49620

SUMMARY OF THE INVENTION

In view of the aforementioned problems, the present invention aims at providing an insulated gate semiconductor device and a method of manufacturing the same that can protect the gate insulating film at the bottom of the trench from high voltages during reverse bias.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an insulated gate semiconductor device, including: a drift layer of a first conductivity type made of a semiconductor material having a wider bandgap than silicon, a top surface of the semiconductor material having an off-angle; a base region of a second conductivity type made of the semiconductor material, disposed above the drift layer; a first high-impurity region of the first conductivity type, embedded in a top of the base region and having a higher impurity density than the drift layer, wherein a trench is provided penetrating the first high-impurity region and the base region; a gate insulating film disposed on side surfaces and a bottom surface of the trench; an embedded gate electrode embedded inside the trench, with the gate insulating film being interposed between the trench and the embedded gate electrode; a second high-impurity region of the first conductivity type made of the semiconductor material, disposed on a bottom surface side of the drift layer; a gate bottom protection region of the second conductivity type, embedded in the drift layer at a bottom of the trench; and a base bottom embedded region of the second conductivity type, embedded in the drift layer below the base region separately from the gate bottom protection region, and having a higher impurity density than the base region, wherein a cross-section of the base bottom embedded region has a trapezoid-shaped portion on at least a bottom side of the base bottom embedded region, an upper base and a lower base of the trapezoid are parallel, and a virtual straight line that connects a midpoint of the upper base and a midpoint of the lower base is tilted from a line normal to the top surface of the drift layer towards a direction of the off-angle by a prescribed tilt angle, and wherein a bottom surface of the base bottom embedded region is deeper than a bottom surface of the gate bottom protection region.

In another aspect, the present disclosure provides a method of manufacturing an insulated gate semiconductor device, the method including: forming a drift layer of a first conductivity type made of a semiconductor material having a wider bandgap than silicon, a top surface of the semiconductor material having an off-angle; forming a gate bottom protection region of a second conductivity type inside the drift layer by performing ion implantation in a direction perpendicular to a top surface of the drift layer; forming a base bottom embedded region of the second conductivity type inside the drift layer by performing ion implantation in a prescribed titled direction in which channeling of implanted impurities occurs in a direction that is tilted relative to a line normal to the top surface of the drift layer towards a direction of the off-angle, the base bottom embedded region being formed such that a position of the bottom surface of the base bottom embedded region being deeper than the gate bottom protection region in the drift layer; forming a base region of the second conductivity type made of the semiconductor material above the drift layer; forming a first high-impurity region of the first conductivity type in a top of the base region at a higher impurity density than the drift layer; forming a base contact region of the second conductivity type in the top of the base region above the base bottom embedded region; forming a trench penetrating the base region and reaching the gate bottom protection region; forming a gate insulating film on side walls and a bottom surface of the trench; and forming an embedded gate electrode in the trench, with the gate insulating film interposed between the trench and the embedded gate electrode.

The present invention makes it possible to provide an insulated gate semiconductor device and a method of manufacturing the same that can protect the gate insulating film at the bottom of the trench from high voltages during reverse bias by using channeling ion implantation.

It is to be understood that both the foregoing general description and the following detailed description are exemplary and explanatory, and are intended to provide further explanation of the invention as claimed.

DETAILED DESCRIPTION OF EMBODIMENTS

Figure 1A:
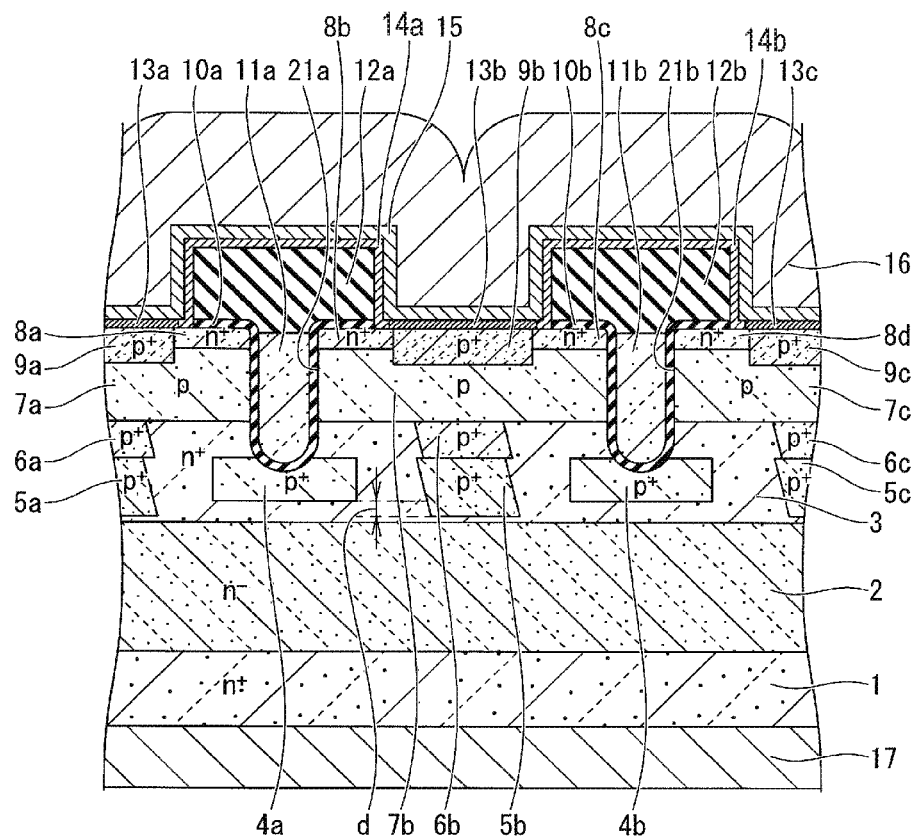
FIG. 1A is a cross-sectional view of main parts of one example of an insulated gate semiconductor device in an embodiment of the present invention.

Embodiments of the present invention will be described below with reference to the drawings. In the description below, portions in the drawings that are the same or similar will be assigned the same or similar reference characters. However, it should be noted that the drawings are schematic, and that the relation between the thickness and planar dimensions and the ratio of thicknesses of the respective layers differ in practice. Thus, specific thicknesses and dimensions should be determined in reference to the description below. Furthermore, there are naturally portions that differ in dimensional relations and ratios in their depiction among different drawings.

In the present specification, the "first main electrode region" means a semiconductor region serving as either the source region or drain region in an insulated gate FET (MISFET), an insulated gate static induction transistor (MISSIT), or the like. In an insulated gate bipolar transistor (IGBT), the "first main electrode region" means a semiconductor region serving as either the emitter region or collector region, and in an MIS gate static inductor thyristor (MIS gate SI thyristor), it means a semiconductor region serving as either the anode region or cathode region. The "second main electrode region" means a semiconductor region serving as whichever of the source region or drain region that is not the first main electrode region in the MISFET and MISSIT, means a region serving as whichever of the emitter region or collector region that is not the first main electrode region in the IGBT, or means a region serving as whichever of the anode region or cathode region that is not the first main electrode region in the MIS gate SI thyristor. In other words, if the "first main electrode region" is the source region, then "second main electrode region" means the drain region. If the "first main electrode region" is the emitter region, then "second main electrode region" means the collector region. If the "first main electrode region" is the anode region, then "second main electrode region" means the cathode region.

In the description of the embodiments below, the first conductivity type is illustratively described as n-type and the second conductivity type as p-type, but the conductivity types may be reversed, where the first conductivity type is p-type and the second conductivity type is n-type. In the present specification and the attached drawings, "+" or "−" attached to an "n" or "p" as superscript signifies a semiconductor region in which the impurity density is higher or lower, respectively, than a semiconductor region which is described without the "+" or "−". Moreover, in the description below, even if it not explicitly limited as such, it is both technically and logically obvious that members or regions to which the limitation of "first conductivity type" and "second conductivity type" have been added signify members or regions made of a semiconductor material. Furthermore, when representing Miller indices in the present specification, "−" signifies a bar attached to the index immediately thereafter, and attaching a "−" before the index represents a negative index.

Furthermore, in the description below, the definition of "top" and "bottom" such as in "top surface" and "bottom surface" are merely expressions for the shown cross-sectional views, and if the orientation of the insulated gate semiconductor device were changed 90°, then "top" and "bottom" would be called "left" and "right," and if changed 180°, "top" and "bottom" would be reversed and called "bottom" and "top," for example.

<Structure of Insulated Gate Semiconductor Device>

As shown in FIG. 1A, the insulated gate semiconductor device in an embodiment of the present invention is a MISFET including a first conductivity type (n⁻ type) drift layer 2, and second conductivity type (p-type) base regions 7a, 7b, 7c arranged on the top surface side of the drift layer 2. The tops of the base regions 7a, 7b, 7c are provided with n⁺ first main electrode regions (source regions; first high-impurity region) 8a, 8b, 8c, 8d with a higher impurity density than the drift layer 2. Trenches 21a and 21b are disposed going through the source regions 8a, 8b, 8c, 8d and base regions 7a, 7b, 7c, and gate insulating films 10a, 10b are disposed on the bottom surfaces and side surfaces of the trenches 21a, 21b. Embedded gate electrodes 11a, 11b are embedded inside the trenches 21a, 21b with the gate insulating films 10a, 10b being interposed between the embedded gate electrodes and the trenches. The insulated gate semiconductor device in the embodiment of the present invention is a MISFET, and thus an n⁺ second main electrode region (drain region; second high-impurity region) 1 is disposed on the bottom surface side of the drift layer 2.

For convenience, FIG. 1A shows a cross-sectional view of main components of two individual cell structures each containing the trench 21a or 21b. However, the insulated gate semiconductor device in the embodiment of the present invention can pass a large current if a multi-channel structure is formed by periodically arraying a further plurality of these individual cell structures.

The tops of the base regions 7a, 7b, 7c are provided with p⁺ base contact regions 9a, 9b, 9c of a higher impurity density than the base regions 7a, 7b, 7c, the p⁺ base contact regions being provided so as to contact the source regions 8a, 8b, 8c, 8d. The top of the drift layer 2 is provided with an n⁺ current spreading layer (CSL) 3 of a higher impurity density than the drift layer 2, the CSL being provided so as to be sandwiched between the bottom of the drift layer 2 and the base regions 7a, 7b, 7c. The current spreading layer 3 is provided by introducing n-type impurities into the top of the drift layer 2, and functions to reduce spreading resistance of the carrier. The current spreading layer 3 need not be provided, and instead the top surface of the drift layer 2 may contact the base regions 7a, 7b, 7c at the position where the top surface of the current spreading layer 3 would be.

Figure 1B:
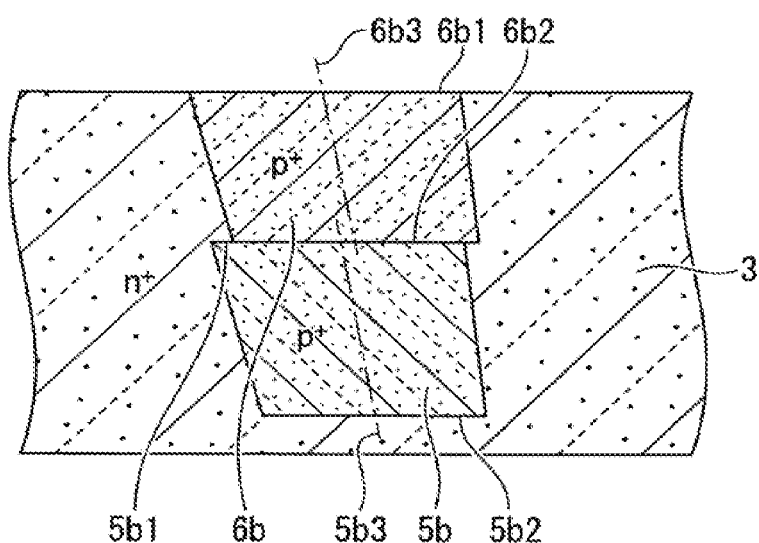
FIG. 1B is a cross-sectional view in which a portion of FIG. 1A has been enlarged.

P⁺ gate bottom protection regions 4a, 4b are arranged at the bottoms of the trenches 21a, 21b in order to protect the gate insulating films 10a, 10b at the bottoms of the trenches 21a, 21b from high voltages during reverse bias. Meanwhile, p⁺ base bottom embedded regions (5a, 6a), (5b, 6b), (5c, 6c) are respectively arranged on the bottom surface sides of the base regions 7a, 7b, 7c below the base contact regions 9a, 9b, 9c. The cross-sectional shape of the base bottom embedded region (5a, 6a), (5b, 6b), (5c, 6c) has a trapezoidal shape at least on the respective bottom sides. FIG. 1B is a cross-sectional view in which portions of the p⁺ base bottom embedded regions 5b, 6b of FIG. 1A have been enlarged.

The base bottom embedded region (5a, 6a) has a shape that has, as a single unit, a trapezoid containing the first embedded region 5a, which is made of a first trapezoid, and the second embedded region 6a disposed on the top surface of the first embedded region 5a and which is made of a second trapezoid contacting the bottom surface of the base region 7a. The base bottom embedded region (5b, 6b) has a shape that has, as a single unit, a trapezoid containing the first embedded region 5b, which is made of a first trapezoid, and the second embedded region 6b disposed on the top surface of the first embedded region 5b and which is made of a second trapezoid contacting the bottom surface of the base region 7b. The base bottom embedded region (5c, 6c) has a shape that has, as a single unit, a trapezoid containing the first embedded region 5c, which is made of a first trapezoid, and the second embedded region 6c disposed on the top surface of the first embedded region 5c and which is made of a second trapezoid contacting the bottom surface of the base region 7c.

The top surfaces of the first embedded regions 5a, 5b, 5c are provided at the same depth as the top surfaces of the gate bottom protection regions 4a, 4b. The thickness of the first embedded regions 5a, 5b, 5c and gate bottom protection regions 4a, 4b from the top surface to the bottom surface is approximately 0.2 µm to 1 µm, for example, but the bottom surfaces of the first embedded regions 5a, 5b, 5c are provided at deeper positions than the bottom surfaces of the gate bottom protection regions 4a, 4b. A difference d between the bottom surfaces of the first embedded regions 5a, 5b, 5c and the bottom surfaces of the gate bottom protection regions 4a, 4b is approximately 0.1 µm to 0.5 µm, for example. If the difference d is 0.1 µm or greater, for example, then when a high voltage is applied during reverse bias, it is easier for the avalanche current to be pulled into the first embedded regions 5a, 5b, 5c, which is preferable. The thickness of the second embedded regions 6a, 6b, 6c from the top surface to the bottom surface is approximately 0.2 µm to 1 µm.

In the embodiment, the drain region 1 is formed of a semiconductor substrate made of SiC (SiC substrate), and the drift layer 2 is formed of an epitaxial layer made of SiC (SiC layer). In addition to SiC, the drain region 1 and drift layer 2 can be various types of semiconductor material with a bandgap wider than the 1.1 eV bandgap of silicon, such as gallium nitride (GaN), diamond, or aluminum nitride (AlN). It has been reported that the bandgap at room temperature is 2.23 eV for 3C-SiC, 3.26 eV for 4H-SiC, 3.02 eV for 6H-SiC, 3.4 eV for GaN, 5.5 eV for diamond, and 6.2 eV for AN. A wide bandgap semiconductor with a bandgap of 2.0 eV or greater can be used for the drain region 1, drift layer 2, or the like, but for LEDs etc. a "wide bandgap" is usually defined as 2.5 eV or greater. In the present invention, the bandgap of a wide bandgap semiconductor will be described in reference to 2.23 eV, which is a bandgap at room temperature for 3C-SiC.

The trenches 21a, 21b going through the source regions 8a, 8b, 8c, 8d and base regions 7a, 7b, 7c in the depth direction have bottoms that reach the current spreading layer 3. In FIG. 1A, an example is shown in which the bottom surfaces of the trenches 21a, 21b are curved, but the bottom surfaces of the trenches 21a, 21b may be flat. In terms of a planar shape, the trenches 21a, 21b of each individual cell structure may be arrayed in a strip-like shape, or may have a rectangular planar shape, or a polygonal planar shape such as a hexagon shape.

In addition to a silicon oxide film ($SiO_2$ film), the gate insulating films 10a, 10b can be a single layer film of one of a silicon oxynitride (SiON) film, a strontium oxide (SrO) film having a greater dielectric constant than a $SiO_2$ film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or the gate insulating films can be a composite film in which a plurality of these are laminated, or the like.

The material of the embedded gate electrodes 11a, 11b can be a polysilicon layer (a doped polysilicon layer) to which a high concentration of impurities has been added, for example. A first main electrode (source electrode) 16 is disposed on the embedded gate electrodes 11a, 11b with interlayer insulating films 12a, 12b interposed therebetween, the first main electrode being separated from a gate surface electrode (not shown) positioned in the depth direction of the paper. The source electrode 16 electrically connects to the source regions 8a, 8b, 8c, 8d and the base contact regions 9a, 9b, 9c.

First bottom barrier metal layers 13a, 13b, 13c, second bottom barrier metal layers 14a, 14b, and a top barrier metal layer 15 are included in layers below the source electrode 16. The first bottom barrier metal layers 13a, 13b, 13c are arranged so as to be respectively metallurgically connected to the base contact regions 9a, 9b, 9c. The second bottom barrier metal layers 14a, 14b are arranged so as to metallurgically contact the source regions 8a, 8b, 8c, 8d and cover the interlayer insulating films 12a, 12b. The top barrier metal layer 15 is arranged so as to cover the first bottom barrier metal layers 13a, 13b, 13c and second bottom barrier metal layers 14a, 14b. The source electrode 16 is arranged so as to cover the top barrier metal layer 15. For example, the first bottom barrier metal layers 13a, 13b, 13c are formed of a nickel (Ni) film, the second bottom barrier metal layers 14a, 14b are formed of a titanium nitride (TiN) film, the top barrier metal layer 15 is formed of a laminate structure of titanium (Ti)/TiN/Ti, and the source electrode 16 is formed of an aluminum (Al) film. The gate surface electrode can be the same material as the source electrode 16.

A second main electrode (drain electrode) 17 is disposed on the bottom surface side of the drift layer 2 so as to contact the drain region 1. The drain electrode 17 can be a single layer film made of gold (Au), a metal film in which Al, nickel (Ni), and Au have been laminated in the stated order, or the like, and a metal plate such as molybdenum (Mo) or tungsten (W) may be further laminated on the bottommost layer thereof.

Figure 2:
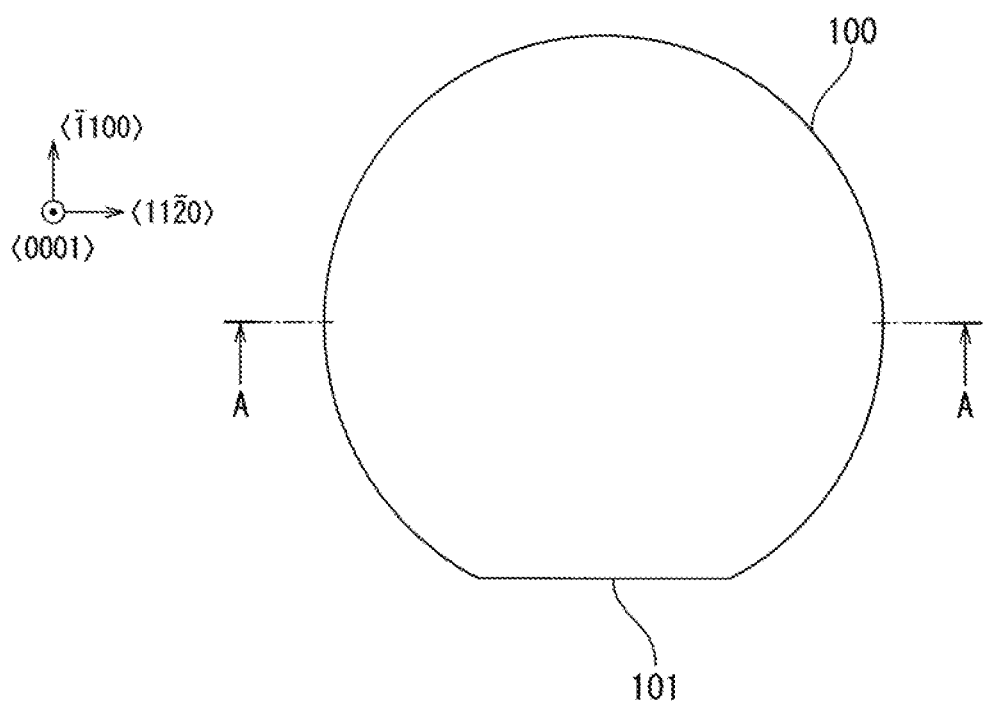
FIG. 2 is a top view of one example of a SiC wafer forming a portion of the insulated gate semiconductor device in the embodiment.

As shown in FIG. 2, the insulated gate semiconductor device in the embodiment is fabricated based on a semiconductor wafer 100 made of SiC. An orientation flat 101 showing the crystal orientation of the semiconductor wafer 100 is provided on the outer periphery of the semiconductor wafer 100. The semiconductor wafer 100 is sliced along a direction serving as a surface tilted by a fixed offset angle (off-angle) θ1 relative to a specific crystal orientation, and the position of the orientation flat 101 is determined by the crystal orientation. A notch may be provided in the outer periphery of the semiconductor wafer 100 instead of the orientation flat 101.

Figure 3:
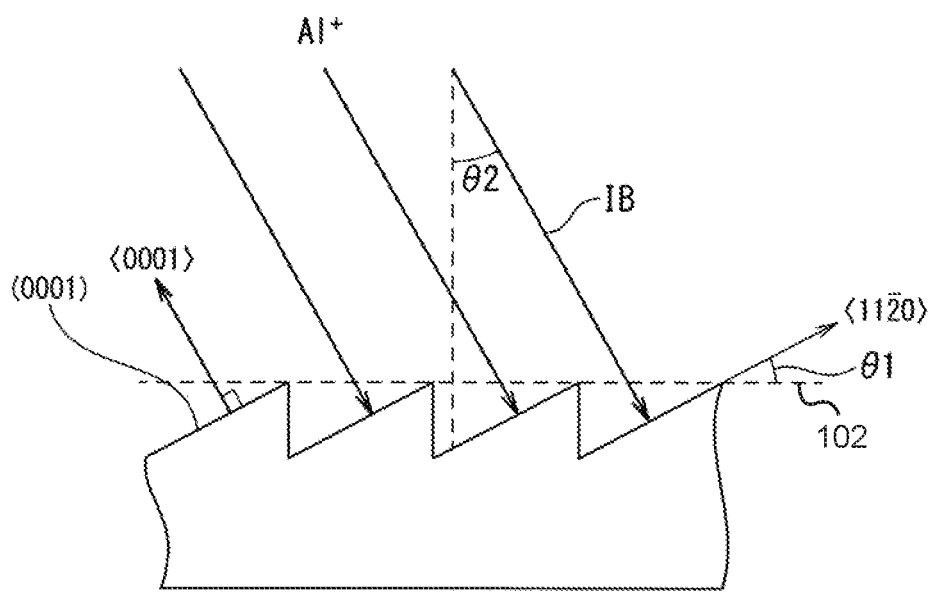
FIG. 3 is a view in which a portion of the SiC wafer seen from the A-A direction in FIG. 2 has been enlarged.

As schematically shown in FIG. 3, the semiconductor wafer 100 has an off-angle θ1 of approximately 4° to 8°, such as greater than 3° and less than or equal to 8°, for example, in the <11-20> direction about the <0001> (c-axis) direction. The off-angle θ1 is an angle formed by a surface 102 of the semiconductor wafer 100 and the surface (substrate bottom surface) perpendicular to the c-axis, which is the (0001)-plane (Si-plane) or (000-1)-plane (C-plane).

Figure 4A:
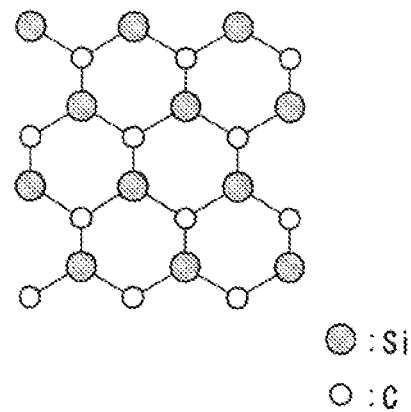
FIG. 4A is a schematic view of a 4H-SiC crystal seen from the m-plane.
Figure 4B:
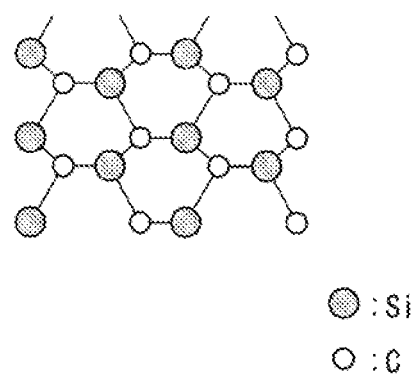
FIG. 4B is a schematic view of a 4H-SiC crystal seen from the Si-plane.
Figure 5:
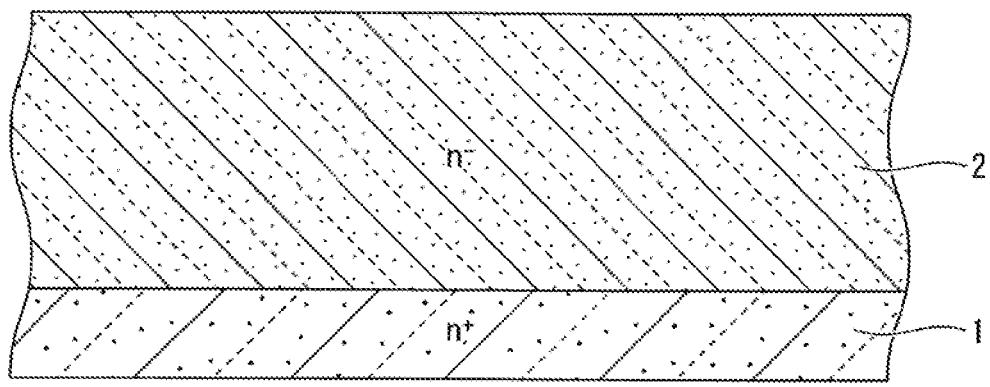
FIG. 5 is a cross-sectional view of a step for describing one example of a method of manufacturing the insulated gate semiconductor device in the embodiment.

FIG. 4A schematically shows the crystal structure of 4H-SiC seen from the m-plane direction, which is the (1-100)-plane perpendicular to the (0001)-plane, and FIG. 4B schematically shows the crystal structure of 4H-SiC seen from the Si-plane. Both have sparse portions with no overlapping atoms. This is the same when viewed from the C-plane on the side opposite to the Si-plane. Thus, if ion implantation is performed from a direction parallel etc. to the c-axis, channeling will occur, in which the ions pass through the gaps in the crystal structure of the SiC and are deeply implanted.

For a wide bandgap semiconductor material such as SiC, it is difficult to set the projected range of the ions to be deep, as compared to Si, and if a heat treatment is performed after ion implantation, barely any of the implanted ions will be diffused. Meanwhile, in the semiconductor device in the embodiment shown in FIG. 1A, the bottom surfaces of the first embedded regions 5a, 5b, 5c are formed at a deeper position than the bottom surfaces of the gate bottom protection regions 4a, 4b, but an extremely high acceleration voltage is needed in order to implant ions at a deep position, which makes formation extremely difficult.

Thus, as shown in FIG. 3, the channeling direction is selected by adjusting an ion implantation angle (tilt angle) θ2 such that an ion beam IB is tilted in a direction (hereinafter, "off-angle direction") measured in the off-angle θ1 relative to a line normal to the surface 102 of the semiconductor wafer 100, thus performing ion implantation in a direction tilted relative to the surface 102 of the semiconductor 100 in order to intentionally generate a channeling phenomenon. The tilt angle θ2 is an angle formed between the ion beam IB and a line normal to the surface 102 of the semiconductor wafer 100. The tilt angle θ2 can be adjusted by tilting the stage on which the semiconductor wafer 100 is mounted, for example. The channeling direction of the ion beam IB is preferably within ±5° measured in the off-angle direction relative to the c-axis, more preferably within ±3° measured in the off-angle direction relative to the c-axis, and most preferably parallel to the c-axis.

In the insulated gate semiconductor device in the embodiment, the tilt angle θ2 is adjusted such that the channeling direction of the ion beam IB is tilted relative to a line normal to the top surface of the drift layer 2 (current spreading layer 3) toward the off-angle direction to select the channeling direction, and channeling ion implantation is performed in the selected channeling direction in order to form the first embedded regions 5a, 5b, 5c and second embedded regions 6a, 6b, 6c. If, instead of tilted ion-implantation, a plurality of stages of ion implantation were performed in order to form a traditional box profile, the first embedded regions and second embedded regions would be trapezoids having parallel upper bases and lower bases, with the lower base being slightly shorter than the upper base by approximately 0.1 μm or less. In such a case, in terms of a line connecting the midpoint of the upper base to the midpoint of the lower base, the line would be perpendicular to the top surface of the drift layer 2. With the channeling implantation, however, the cross sections of the first embedded regions 5a, 5b, 5c and second embedded regions 6a, 6b, 6c are each an approximate parallelogram having oblique sides substantially parallel to the channeling direction. Here, the left side surface of the first embedded regions 5a, 5b, 5c and the left side surface of the second embedded regions 6a, 6b, 6c, which are the oblique sides of the approximate parallelograms, are tilted steeper than the right side surfaces, respectively. Namely, the first embedded regions 5a, 5b, 5c and second embedded regions 6a, 6b, 6c are trapezoids in which the upper base and lower base are parallel, and the line connecting the midpoint of the upper base and the midpoint of the lower base has a tilt angle that is tilted relative to a line normal to the top surface of the drift layer 2 toward the off-angle direction. As shown in FIG. 1B, an upper base 5b1 and lower base 5b2 of the first embedded region 5b are parallel, and a line 5b3 connecting the midpoint of the upper base 5b1 and the midpoint of the lower base 5b2 has a tilt angle that is tilted toward the off-angle direction. In the same manner, an upper base 6b1 and lower base 6b2 of the second embedded region 6b are parallel, and a line 6b3 connecting the midpoint of the upper base 6b1 and the midpoint of the lower base 6b2 has a tilt angle that is tilted toward the off-angle direction. The tilt angle of the side surfaces of the first embedded regions 5a, 5b, 5c and second embedded regions 6a, 6b, 6c is an angle within ±5° measured in the off-angle direction relative to the c-axis of the crystal structure forming the drift layer 2, for example.

During operation of the insulated gate semiconductor device in the embodiment, a positive voltage is applied to the drain electrode 17, and when a positive voltage greater than or equal to a threshold value is applied to the embedded gate electrodes 11a, 11b, an inversion layer (channel) is formed on the side of the base regions 7a, 7b, 7c closer to the embedded gate electrodes 11a, 11b, thereby turning the device ON. While ON, current flows from the drain electrode 17 through the drain region 1, drift layer 2, the inversion layer of the base regions 7a, 7b, 7c, and the base regions 8a, 8b, 8d, to the source electrode 16. Meanwhile, if the voltage applied to the embedded gate electrodes 11a, 11b is less than the threshold value, the inversion layer is not formed in the base regions 7a, 7b, 7c; thus, the device is OFF, and current does not flow from the drain electrode 17 to the source electrode 16.

In the insulated gate semiconductor device according to the embodiment, the bottom surfaces of the first embedded regions 5a, 5b, 5c are provided at deeper positions than the bottom surfaces of the gate bottom protection regions 4a, 4b, which makes it easier for avalanche current to be drawn to the first embedded regions 5a, 5b, 5c when a high voltage is applied during reverse bias, and this makes it possible to protect the gate insulating films 10a, 10b at the bottom of the trenches 21, 21b from high voltages during reverse bias.

<Method of Manufacturing Insulated Gate Semiconductor Device>

Next, one example of a method of manufacturing the insulated gate semiconductor device according to the embodiment of the present invention will be described in the case of a trench gate MISFET, with reference to FIGS. 5-17. The method of manufacturing the trench gate MISFET described below is one example, and various other types of methods of manufacturing can be performed, including the modification examples, within the scope set forth in the claims.

First, an $n^+$ semiconductor substrate (SiC substrate) to which n-type impurities such as nitrogen (N) have been added is prepared. In the description below, the SiC substrate is a 4H-SiC substrate and has an off-angle of 4°. The $n^-$ drift layer 2 is epitaxially grown on the top surface of the drain region 1, with the $n^+$ SiC substrate as the drain region 1. The epitaxial growth also gives the top surface of the drift layer 2 an off-angle of 4°.

Figure 6:
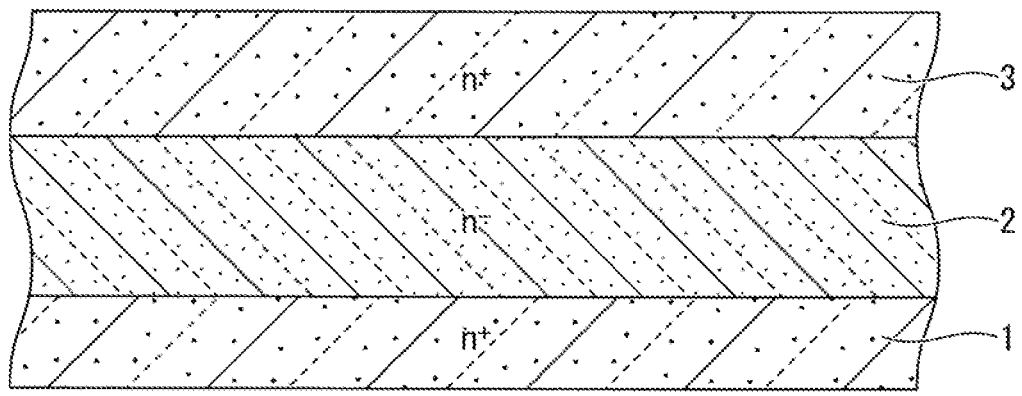
FIG. 6 is a cross-sectional view of a step after FIG. 5 for describing one example of the method of manufacturing the insulated gate semiconductor device in the embodiment.

Next, multiple-stage ion implantation is performed from the top surface side of the drift layer 2 into the entire surface of the drift layer 2 with n-type impurity ions such as nitrogen (N). Thereafter, the implanted n-type impurity ions are activated by a heat treatment, and the $n^+$ current spreading layer 3 is formed in the drift layer 2, as shown in FIG. 6. Alternatively, the current spreading layer 3 may be epitaxially grown on the drift layer 2, and the epitaxial growth also gives the top surface of the current spreading layer 3 an off-angle of 4°. Even in such a case, in this disclosure, the epitaxially grown current spreading layer 3 is regarded as constituting an upper portion of a drift layer; i.e., the current spreading layer 3 and the drift layer 2 that is under the current spreading layer 3 together constitute a newly redefined drift layer 2. Furthermore, the current spreading layer 3 need not necessarily be formed, and the following steps may be performed on the drift layer 2. In this disclosure, therefore, the drift layer 2 may or may not include the current spreading layer 3 in its upper portion thereof.

Figure 7:
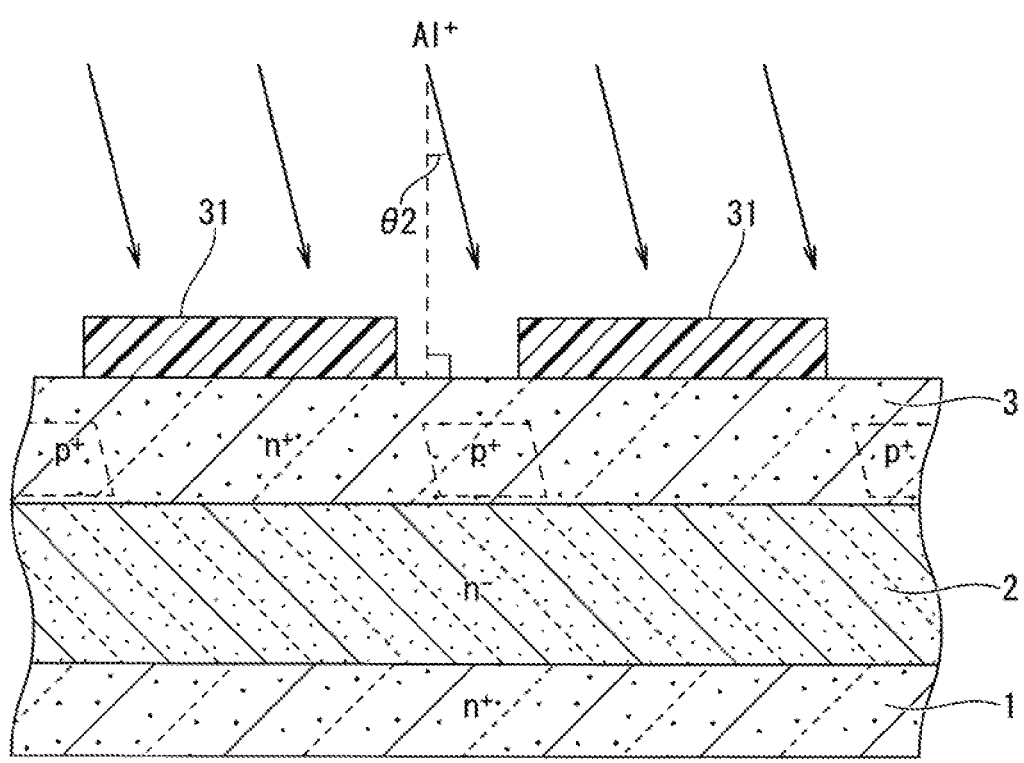
FIG. 7 is a cross-sectional view of a step after FIG. 6 for describing one example of the method of manufacturing the insulated gate semiconductor device in the embodiment.

Next, in order to form the first embedded regions 5a, 5b, 5c shown in FIG. 1A, a photoresist film 31 is coated onto the current spreading layer 3, and photolithography is used to pattern the photoresist film 31. The patterned photoresist film 31 is used as an ion implantation mask to perform multiple-stage ion implantation into deep positions with p-type impurity ions such as Al, as shown in FIG. 7. At such time, the stage on which the SiC substrate is mounted is tilted to adjust the tilt angle θ2, and a channeling direction is selected in which the ion beam is tilted toward the off-angle direction relative to a line normal to the top surface of the current spreading layer 3 in order to perform the multiple-stage ion implantation. Thereafter, the photoresist film is removed through wet processing or the like.

Figure 8:
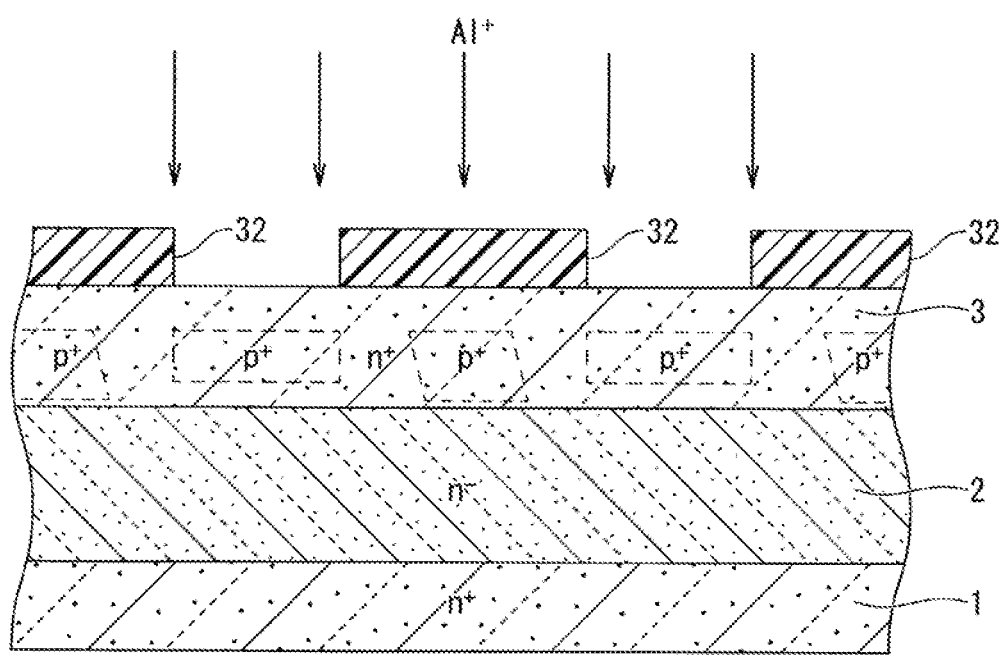
FIG. 8 is a cross-sectional view of a step after FIG. 7 for describing one example of the method of manufacturing the insulated gate semiconductor device in the embodiment.

Next, in order to form the gate bottom protection regions 4a, 4b shown in FIG. 1A, a new photoresist film 32 is coated onto the current spreading layer 3, and photolithography is used to pattern the photoresist film 32. The patterned photoresist film 32 is used as an ion implantation mask, and multiple-stage ion implantation is performed perpendicular to the top surface of the current spreading layer 3 with p-type impurity ions such as Al at a shallower position than previously, as shown in FIG. 8. Thereafter, the photoresist film 32 is removed through wet processing or the like.

Figure 9:
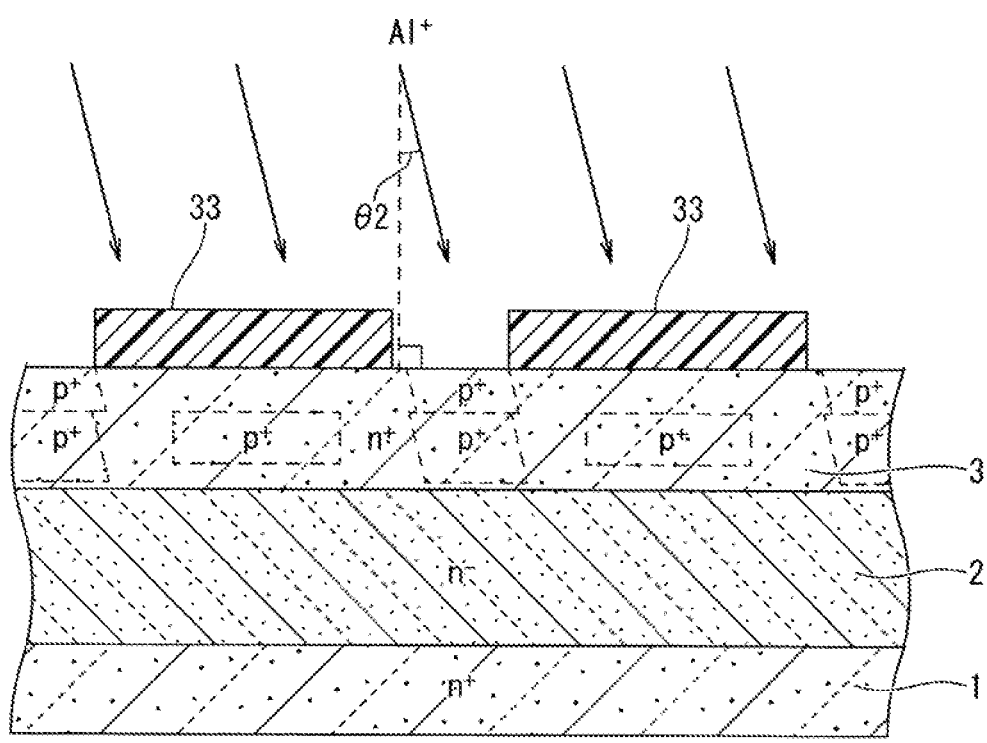
FIG. 9 is a cross-sectional view of a step after FIG. 8 for describing one example of the method of manufacturing the insulated gate semiconductor device in the embodiment.

Next, in order to form the second embedded regions 6a, 6b, 6c shown in FIG. 1A, a new photoresist film 33 is coated onto the current spreading layer 3, and photolithography is used to pattern the photoresist film 33. The patterned photoresist film 33 is used as an ion implantation mask to perform multiple-stage ion implantation with p-type impurity ions such as Al, as shown in FIG. 9. At such time, the stage on which the SiC substrate is mounted is tilted to adjust the tilt angle θ2, and a channeling direction is selected in which the ion beam is tilted toward the off-angle direction relative to a line normal to the top surface of the current spreading layer 3 in order to perform the multiple-stage ion implantation.

The channeling direction of the ion implantation during forming of the second embedded regions 6a, 6b, 6c may be the same direction as the channeling direction when forming the first embedded regions 5a, 5b, 5c, or may differ within a range in which channeling is caused to occur. In order to form the second embedded regions 6a, 6b, 6c in shallower positions than the first embedded regions 5a, 5b, 5c, the acceleration voltage of the ion implantation when forming the second embedded regions 6a, 6b, 6c is set lower than the acceleration voltage when forming the first embedded regions 5a, 5b, 5c. The ion implantation when forming the second embedded regions 6a, 6b, 6c may be multiple-stage ion implantation from the direction perpendicular to the top surface of the current spreading layer 3. Thereafter, the photoresist film 33 is removed through wet processing or the like.

Figure 10:
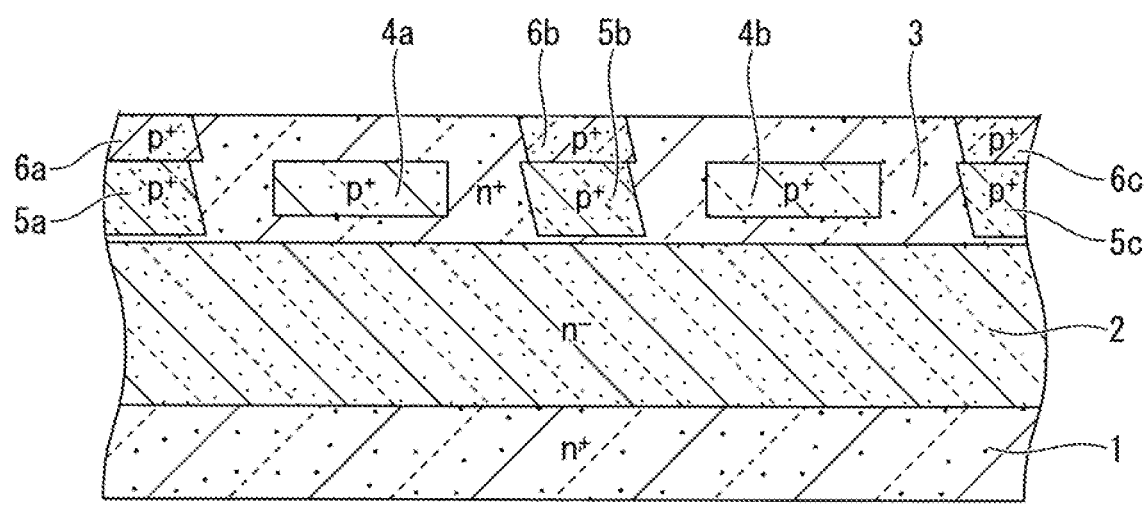
FIG. 10 is a cross-sectional view of a step after FIG. 9 for describing one example of the method of manufacturing the insulated gate semiconductor device in the embodiment.

Next, the implanted p-type impurity ions are activated by a heat treatment, and the $p^+$ gate bottom protection regions 4a, 4b are selectively formed inside the current spreading layer 3, as shown in FIG. 10. In the current spreading layer 3, the $p^+$ first embedded regions 5a, 5b, 5c are formed as parallelogram (first parallelogram) regions in positions deeper than the gate bottom protection regions 4a, 4b. At the same time, the $p^+$ second embedded regions 6a, 6b, 6c are selectively formed in the top of the current spreading layer 3 as parallelogram (second parallelogram) regions; thus, the base bottom embedded regions (5a, 6a), (5b, 6b), (5c, 6c) are formed in different-level patterns in units of parallelograms.

Figure 11:
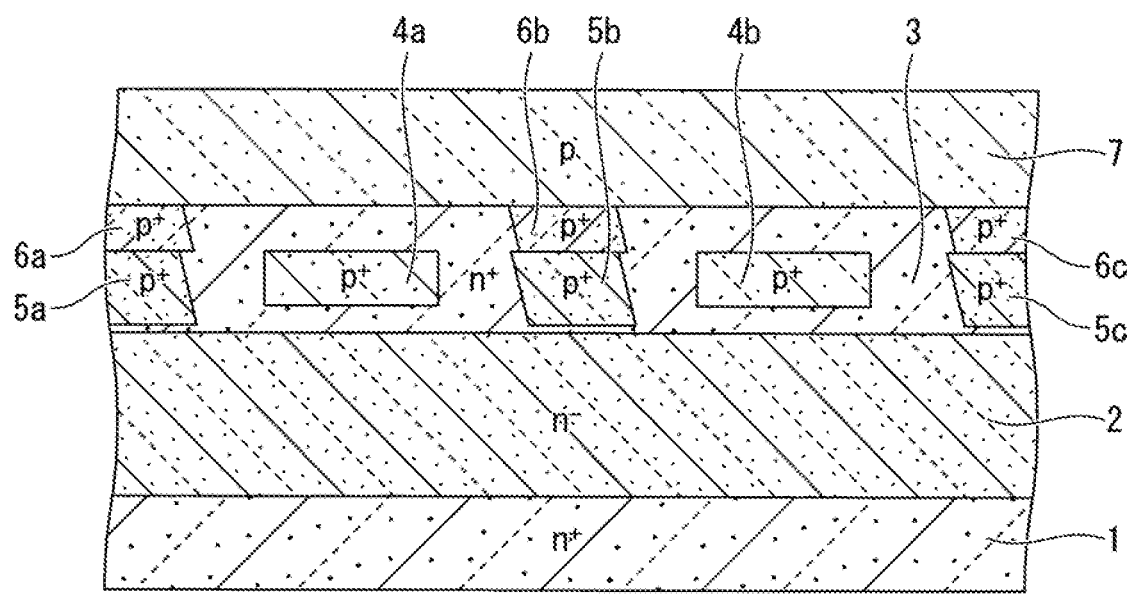
FIG. 11 is a cross-sectional view of a step after FIG. 10 for describing one example of the method of manufacturing the insulated gate semiconductor device in the embodiment.
Figure 12:
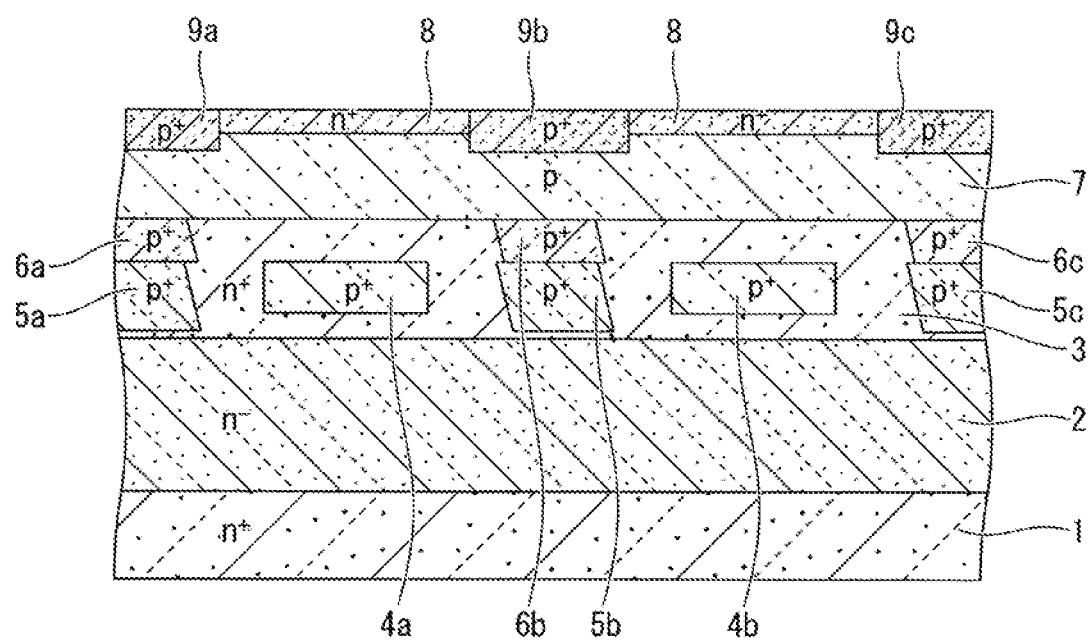
FIG. 12 is a cross-sectional view of a step after FIG. 11 for describing one example of the method of manufacturing the insulated gate semiconductor device in the embodiment.

Next, as shown in FIG. 11, the p-type base region 7 is epitaxially grown on the top surface of the current spreading layer 3. Next, a photoresist film (not shown) is coated onto the base region 7, and photolithography is used to pattern the photoresist film. The patterned photoresist film is used as an ion implantation mask to perform multiple-stage ion implantation of n-type impurity ions such as N. Thereafter, the photoresist film is removed through wet processing or the like. Next, a new photoresist film (not shown) is coated onto the base region 7, and photolithography is used to pattern the new photoresist film. The patterned new photoresist film is used as a new ion implantation mask to perform multiple-stage ion implantation of p-type impurity ions such as Al from the top surface side of the drift layer 2. Thereafter, the implanted n-type impurity ions and p-type impurity ions are activated by performing a heat treatment, and the $n^+$ source regions 8 and $p^+$ base contact regions 9a, 9b, 9c are formed in the top surface of the base region 7, as shown in FIG. 12.

Figure 13:
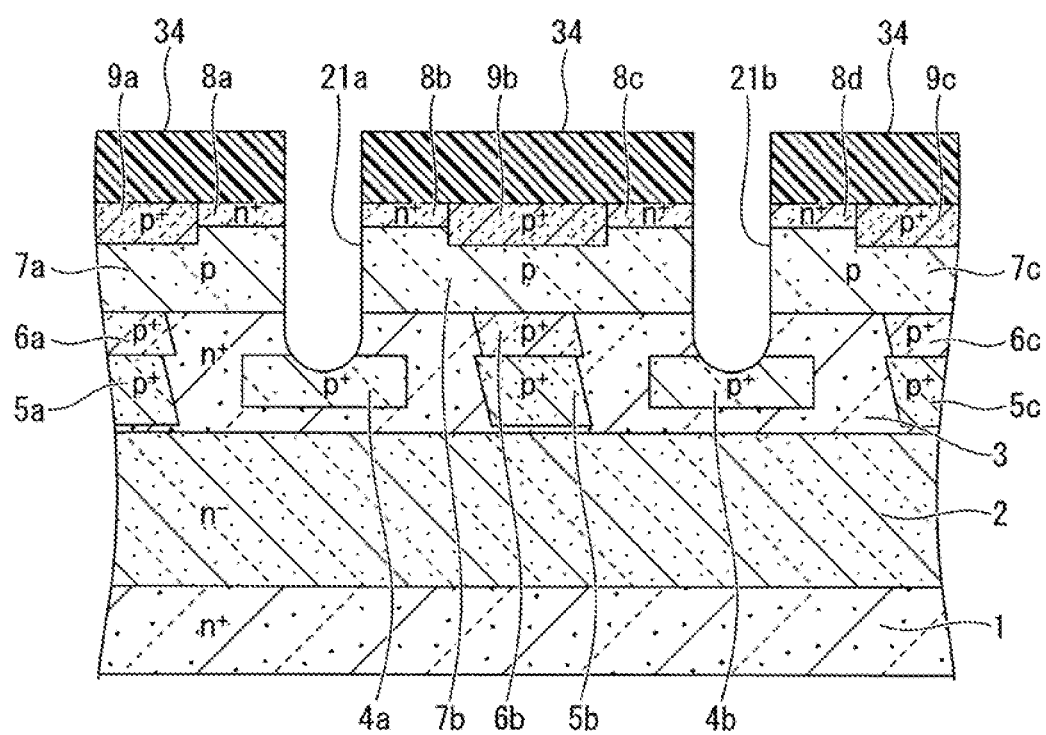
FIG. 13 is a cross-sectional view of a step after FIG. 12 for describing one example of the method of manufacturing the insulated gate semiconductor device in the embodiment.

Next, a photoresist film 34 is coated onto the $n^+$ source regions 8 and $p^+$ base contact regions 9a, 9b, 9c, and photolithography is used to pattern the photoresist film 34. The patterned photoresist film 34 is used as an etching mask for dry etching etc. such as reactive ion etching (RIE), and the trenches 21a, 21b are selectively formed going through the source regions 8a, 8b, 8c, 8d and base regions 7a, 7b, 7c to reach the top of the current spreading layer 3, as shown in FIG. 13. Thereafter, the photoresist film 34 is removed through wet processing or the like. The trenches 21a, 21b may be formed by dry etching using an oxide film as an etching mask after an oxide film is formed on the source regions 8 and $p^+$ base contact regions 9a, 9b, 9c and patterned via a photoresist film.

Figure 14:
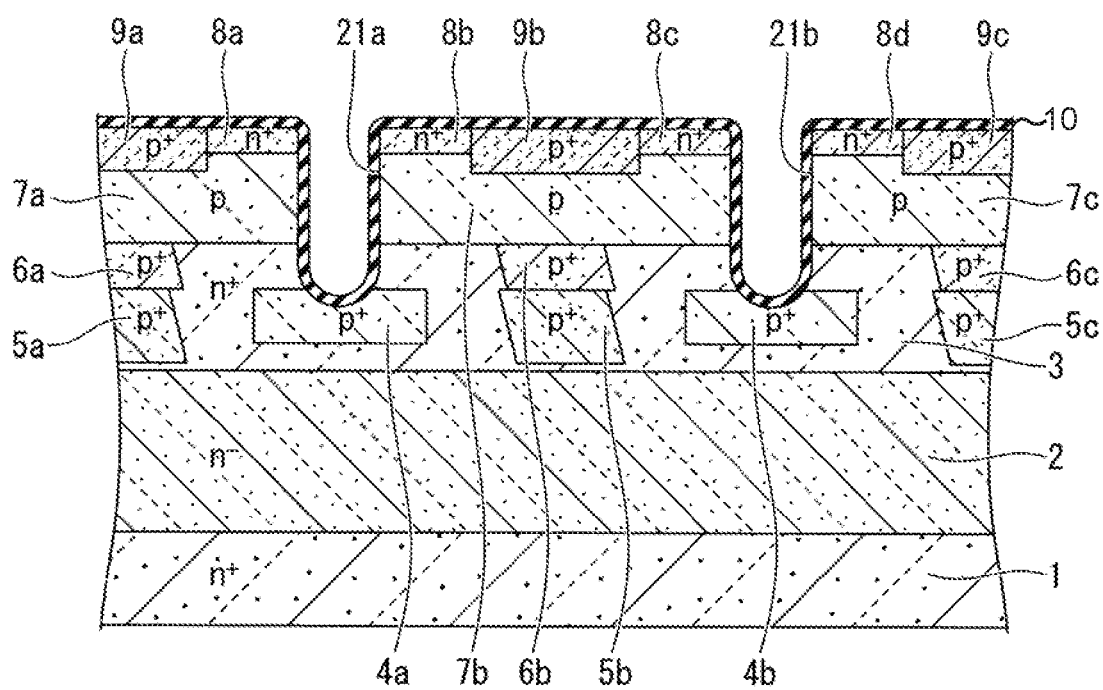
FIG. 14 is a cross-sectional view of a step after FIG. 13 for describing one example of the method of manufacturing the insulated gate semiconductor device in the embodiment.
Figure 15:
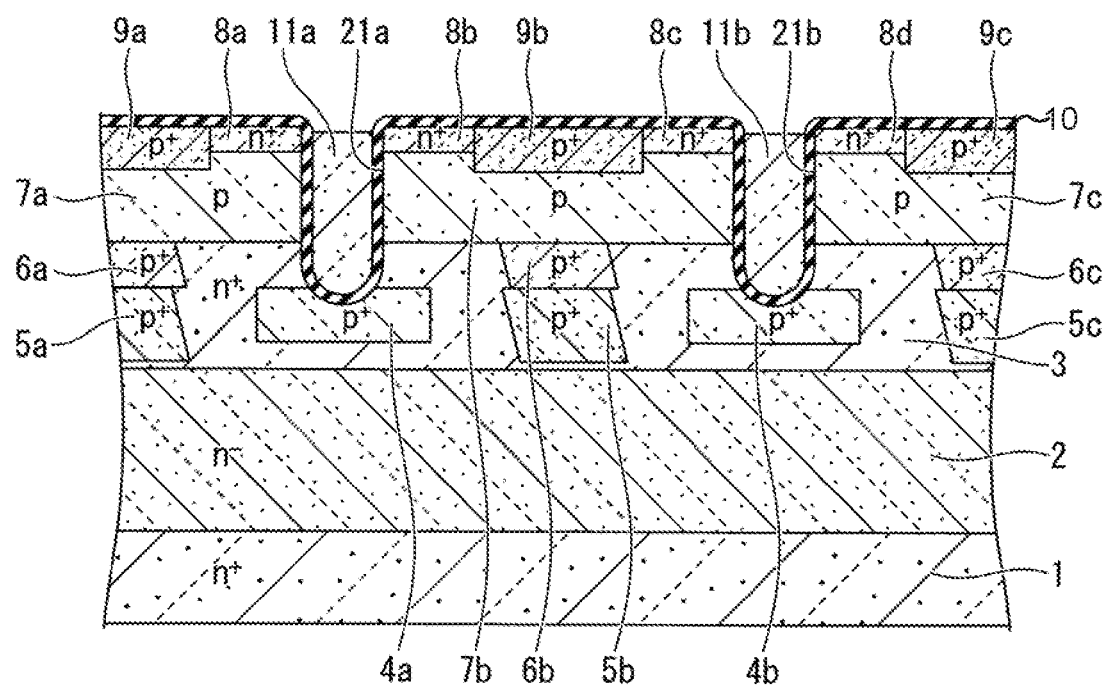
FIG. 15 is a cross-sectional view of a step after FIG. 14 for describing one example of the method of manufacturing the insulated gate semiconductor device in the embodiment.

Next, as shown in FIG. 14, the gate insulating film 10 such as a $SiO_2$ film is formed on the bottom surfaces and side surfaces of the trenches 21a, 21b and the top surfaces of the source regions 8 and $p^+$ base contact regions 9a, 9b, 9c via a thermal oxidation method, CVD, etc. Next, CVD etc. is used to deposit a polysilicon layer (doped polysilicon layer) to which a high concentration of impurities such as N have been added on the gate insulating film 10. Thereafter, etch-back is performed on the polysilicon layer to embed the polysilicon layer inside the trenches 21a, 21b via the gate insulating film 10. This results in formation of the embedded gate electrodes 11a, 11b, which are made of the polysilicon layer, as shown in FIG. 15.

Figure 16:
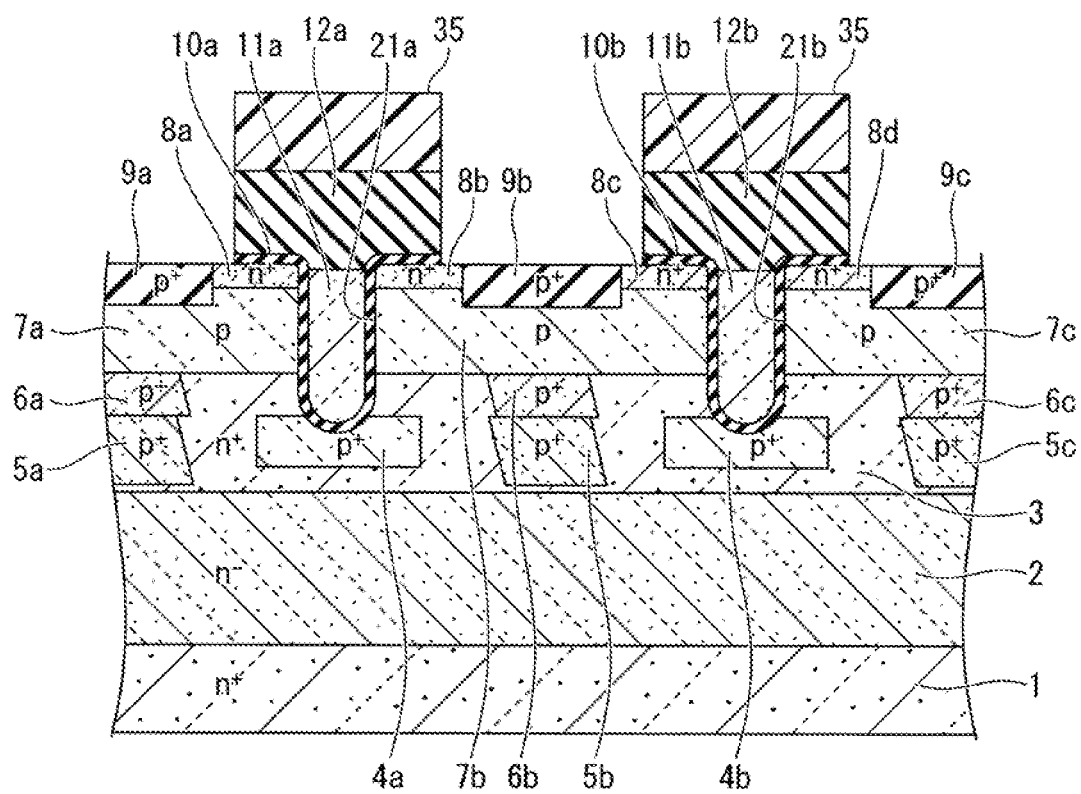
FIG. 16 is a cross-sectional view of a step after FIG. 15 for describing one example of the method of manufacturing the insulated gate semiconductor device in the embodiment.
Figure 17:
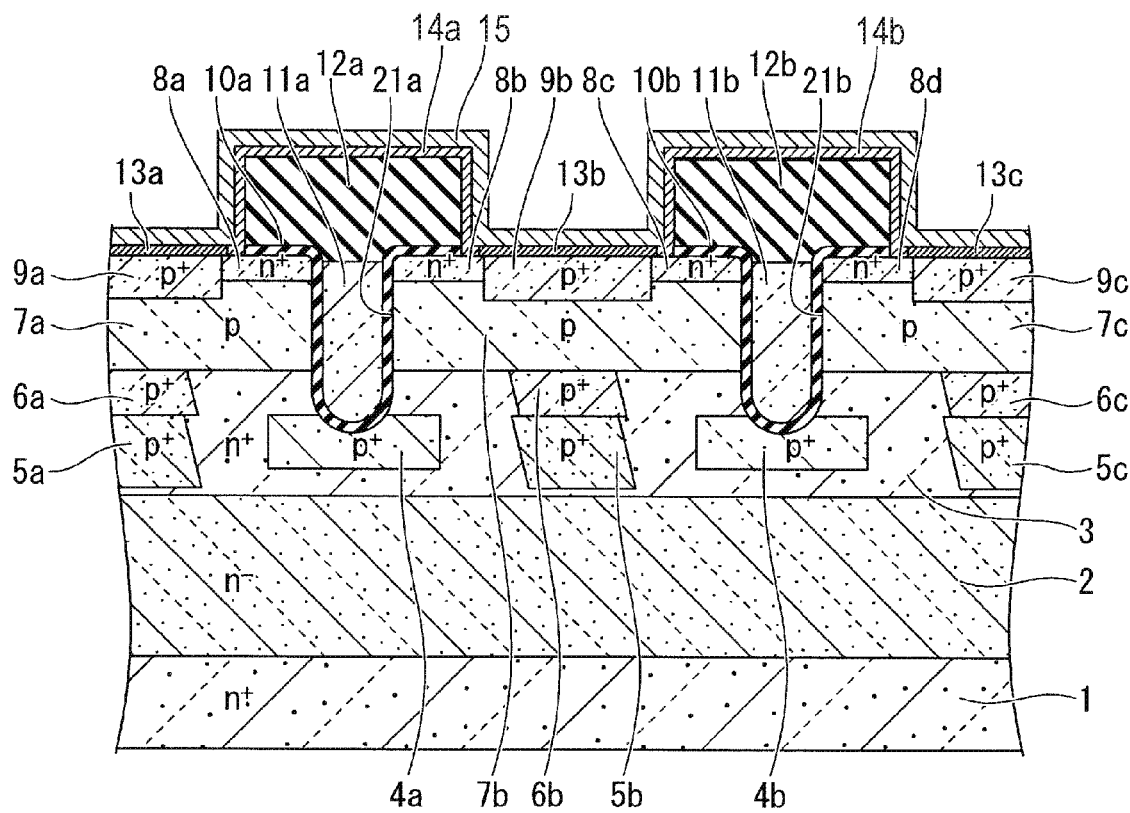
FIG. 17 is a cross-sectional view of a step after FIG. 16 for describing one example of the method of manufacturing the insulated gate semiconductor device in the embodiment.

Next, CVD etc. is used to deposit the interlayer insulating film such as a $SiO_2$ film on the embedded gate electrodes 11a, 11b and gate insulating film 10. A photoresist film 35 is coated onto the interlayer insulating film and photolithography is used to pattern the photoresist film 32. The patterned photoresist film 35 is used as an etching mask while dry etching is performed to selectively remove the interlayer insulating films 12a, 12b and gate insulating films 10a, 10b such that these films remain on the embedded gate electrodes 11a, 11b, as shown in FIG. 16, thereby opening source contact holes. Although not shown, gate contact holes are also opened in the interlayer insulating films 12a, 12b and gate insulating films 10a, 10b in a location differing from the source contact holes such that at least a portion of the gate surface electrode connected to the embedded gate electrodes 11a, 11b is exposed. Thereafter, the photoresist film 35 is removed through wet processing or the like.

Next, a metal layer such as a Ni film is deposited via sputtering or evaporation, and photolithography and RIE etc. are used to pattern the metal layer and form the first bottom barrier metal layers 13a, 13b, 13c. Next, a metal layer such as a TiN film is deposited via sputtering etc., and photolithography and RIE etc. are used to pattern the metal layer and form the second bottom barrier metals 14a, 14b. Next, metal layers such as Ti/TiN/Ti/Al films are continuously deposited via sputtering or the like. Photolithography and RIE etc. are used to pattern the metal layers such as the Ti/TiN/Ti/Al films, thus forming source electrode 16 and gate surface electrode (not shown) patterns that include the top barrier metal layer 15 on the bottom. This results in the patterns of the source electrode 16 and gate surface electrode separating. Next, sputtering or evaporation etc. is used to form the drain electrode 17 made of Au or the like on the entire bottom surface of the drain region 1, as shown in FIG. 1A. The insulated gate semiconductor device in the embodiment is completed in this manner.

In the manufacturing method of the insulated gate semiconductor device according to the embodiment, when the first embedded regions 5a, 5b, 5c are to be formed, the ion beam is tilted toward the off-angle direction relative to a line normal to the top surface of the current spreading layer 3, in order to select the channeling direction and then perform multiple-stage ion implantation. This makes it possible to cause the channeling phenomenon to occur so as to make the projected range of the ions deep, and allows the positions of the bottom surfaces of the first embedded regions 5a, 5b, 5c to be formed in positions deeper than the positions of the bottom surfaces of the gate bottom protection regions 4a, 4b. This makes it possible to provide an insulated gate semiconductor device that can protect the gate insulating films 10a, 10b on the bottom of the trenches 21a, 21b from high voltages during reverse bias.

Figure 18:
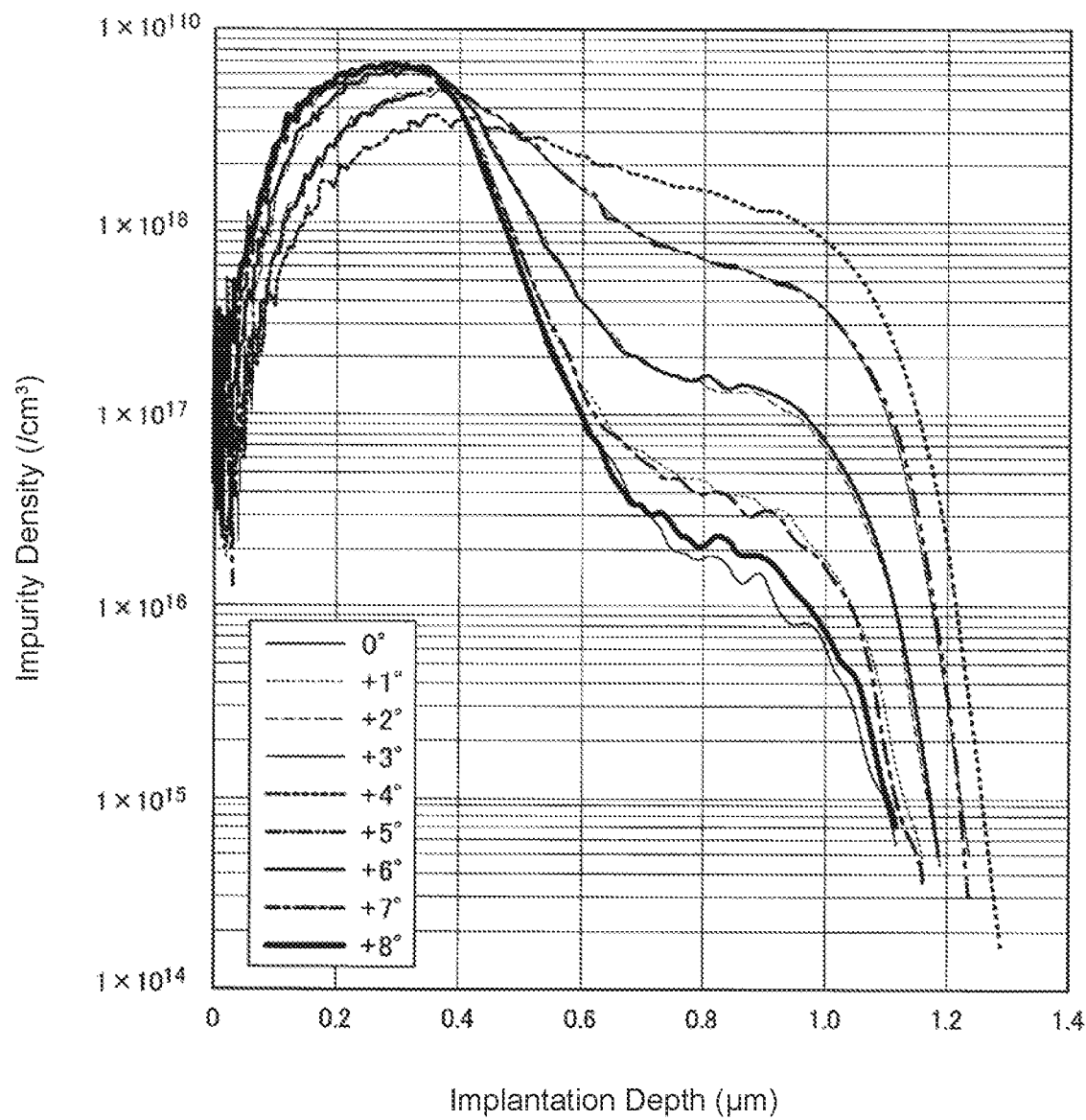
FIG. 18 is a graph showing the relationship between implantation depth and impurity density when a tilt angle has been changed toward an off-angle direction during ion implantation in the method of manufacturing the insulated gate semiconductor device in the embodiment.
Figure 19:
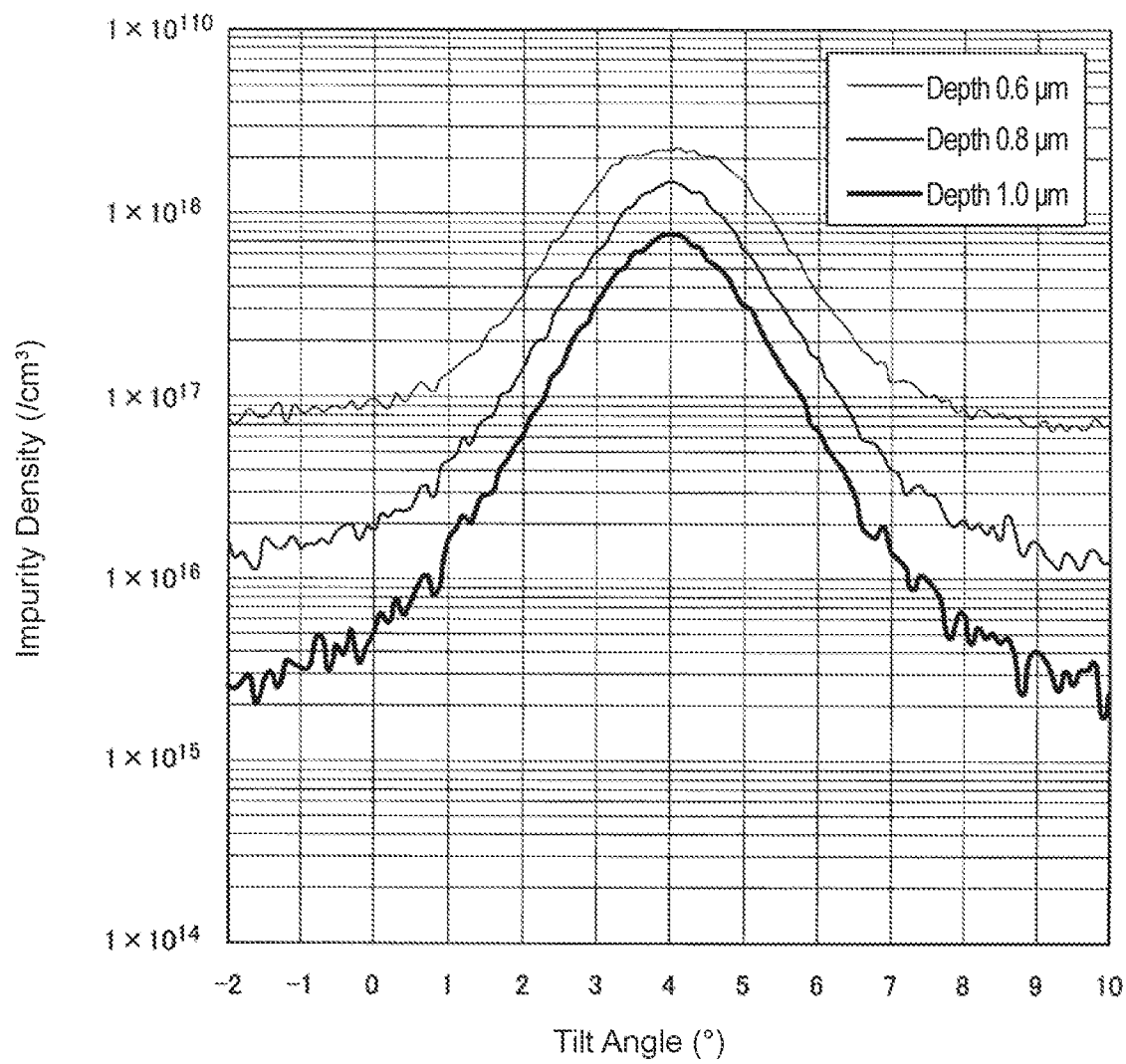
FIG. 19 is a graph showing the relationship between the tilt angle and impurity density during ion implantation in the method of manufacturing the insulated gate semiconductor device in the embodiment.

FIG. 18 shows a profile that is the result of a Monte Carlo simulation when the tilt angle is changed in the off-angle direction and Al ions are implanted in four stages during ion implantation to form the first embedded regions 5a, 5b, 5c shown in FIG. 1A. The first stage was 350 keV, $7.0\times10^{13}$ atoms/cm$^2$, the second stage was 300 keV, 5.0×10$^{13}$ atoms/cm$^2$, the third stage was 200 keV, 5.5×10$^{13}$ atoms/cm$^2$, and the fourth stage was 120 keV, 2.0×10$^{13}$ atoms/cm$^2$. FIG. 19 shows tilt angle dependency for depths of 0.6 μm, 0.8 μm, and 1 μm shown in FIG. 18. From FIG. 18 and FIG. 19, it can be understood that channeling is most likely to occur when the tilt angle is 4° (when the ion beam is parallel to the c-axis), with large channeling effects when the tilt angle is within 1° to 7° (when the tilt of the ion beam in the off-angle direction relative to the c-axis is ±3°), and with observable channeling effects even when the tilt angle is −1° to 9° (when the tilt of the ion beam in the off-angle direction relative to the c-axis is ±5°).

Figure 20:
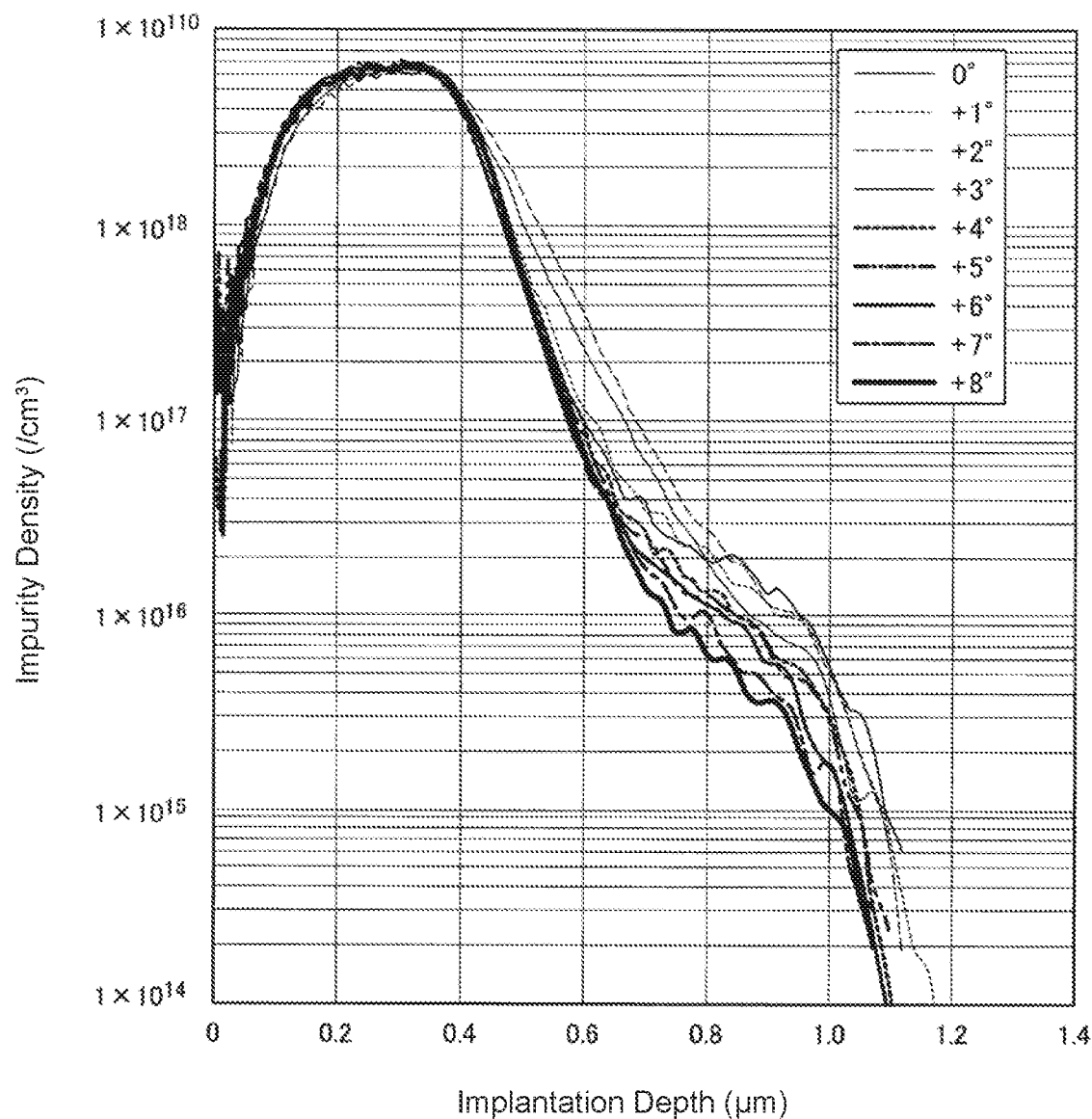
FIG. 20 is a graph showing the relationship between implantation depth and impurity density when the tilt angle has been changed in a direction orthogonal to the off-angle direction during ion implantation in the method of manufacturing the insulated gate semiconductor device in the embodiment.

FIG. 20 shows simulation results when the tilt angle is changed relative to directions other than that of the tilt angle during ion implantation for forming the first embedded regions 5a, 5b, 5c shown in FIG. 1A. From FIG. 20, it can be seen that if the tilt angle θ2 is changed relative to directions other than that of the off-angle, the channeling phenomenon was not observed.

Figure 21:
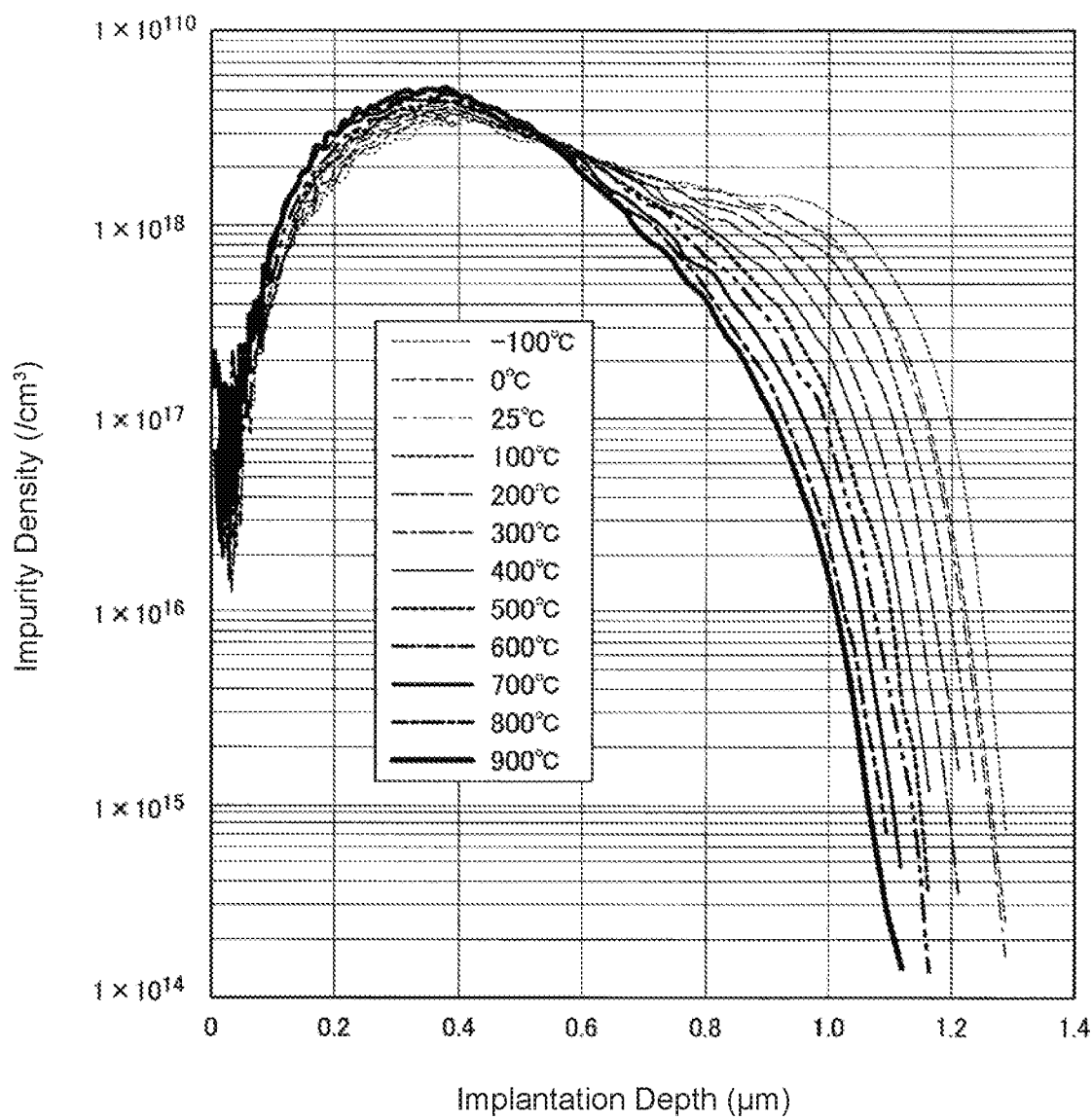
FIG. 21 is a graph showing the relationship between implantation depth and impurity density when the temperature has been changed during ion implantation in the method of manufacturing the insulated gate semiconductor device in the embodiment.

FIG. 21 shows simulation results from changing the temperature during ion implantation in a range of −100° C. to 900° C. during ion implantation for forming the first embedded regions 5a, 5b, 5c shown in FIG. 1A. From FIG. 21, it can be understood that, the lower the temperature is during ion implantation, the easier it is for the channeling phenomenon to occur.

FIRST MODIFICATION EXAMPLE

Figure 22:
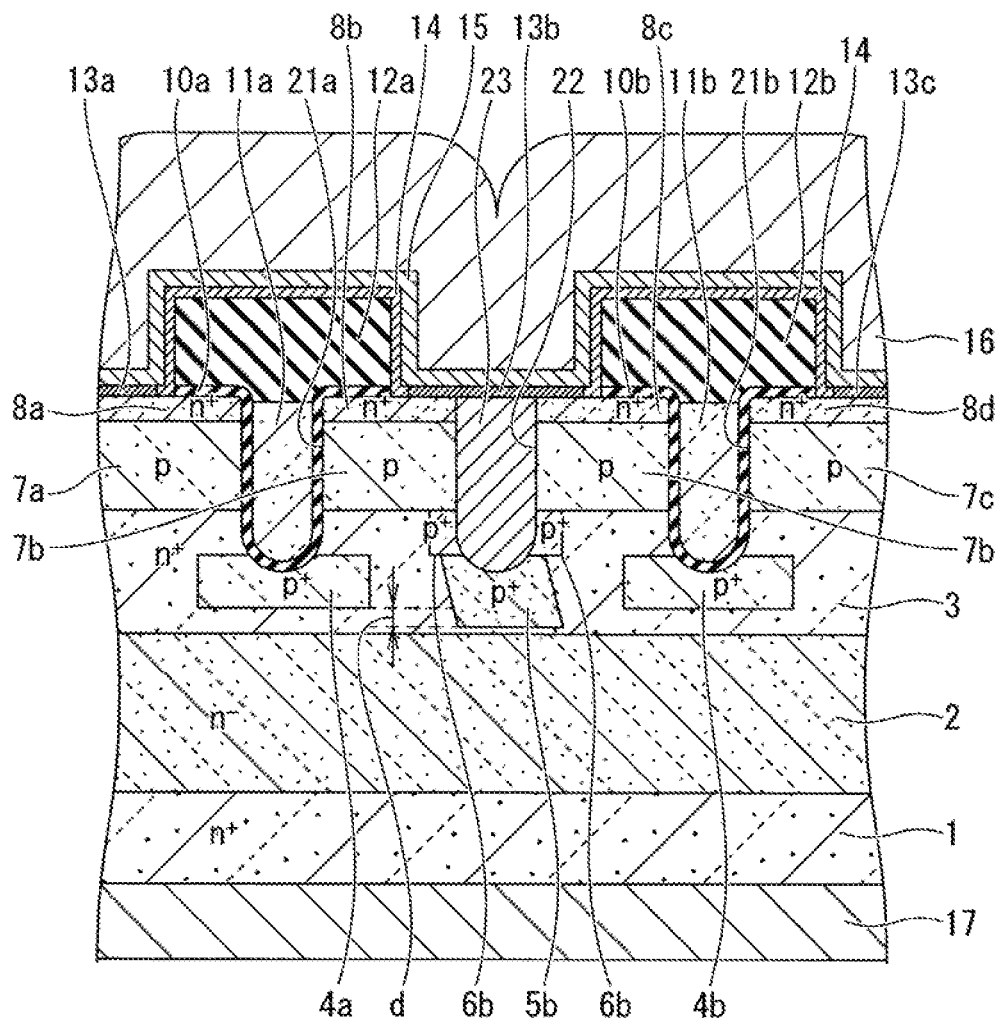
FIG. 22 is a cross-sectional view of main parts of one example of an insulated gate semiconductor device in a first modification example of the embodiment.

A double trench structure will be described as an insulated gate semiconductor device according to the first modification example of the embodiment of the present invention. The double trench structure has a trench structure at the contact portion of the base bottom embedded region (5b, 6b) in addition to the trench structure at the gate portion. As shown in FIG. 22, the insulated gate semiconductor device according to the first modification example differs from the insulated gate semiconductor device shown in FIG. 1A in that, in a position separated from the trenches 21a, 21b, a contact trench 22 is provided so as to go through the base region 7b sandwiched by the trenches 21a, 21b, and a base contact plug 23 is embedded inside the contact trench 22. FIG. 22 illustratively shows only the trenches 21a, 21b and contact trench 22, but in practice a plurality of structures in which the contact trench 22 is sandwiched by the trenches 21a, 21b as shown in FIG. 22 may be provided.

The base contact plug 23 functions as a drawing electrode when breakdown occurs and avalanche current flows from the drain electrode 17 to the source electrode 16. The material of the base contact plug 23 can be a metal such as Al, a polysilicon layer to which impurities have been added (doped polysilicon layer), a high concentration epitaxial layer, or the like, for example. The base contact plug 23 may be formed of the same material as the embedded gate electrodes 11a, 11b, or may be formed of a differing material.

The p$^+$ base bottom embedded region (5b, 6b) is provided on the bottom of the contact trench 22 with its bottom position deeper than the gate bottom protection regions 4a, 4b. The base bottom embedded region (5b, 6b) includes the first embedded region 5b covering the bottom of the base contact plug 23 and the second embedded region 6b contacting the base regions 7b, 7b and the side surfaces of the base contact plug 23.

The cross-sectional shape of the first embedded region 5b is an approximate trapezoid parallelogram, of which the upper base and the lower base are parallel, and a line connecting the midpoint of the upper base and the midpoint of the lower base has a tilt angle tilted relative to a line normal to the top surface of the drift layer 2 toward the off-angle direction. The tilt angle of the side surfaces of the first embedded region 5b is an angle within ±5° measured in the off-angle direction relative to the c-axis of the crystal structure forming the drift layer 2, for example. The side surfaces of the second embedded regions 6b opposite to the base contact plug 23 are illustratively shown as being perpendicular to the top surface of the drift layer 2, but may be parallel to the side surfaces of the first embedded region 5b. The other configurations are the same as the insulated gate semiconductor device in the embodiment shown in FIG. 1A, and thus redundant descriptions will be omitted.

In the insulated gate semiconductor device according to the first modification example, the bottom surfaces of the base bottom embedded region (5b, 6b) at the bottom of the contact trench 22 are provided in positions deeper than the bottom surfaces of the gate bottom protection regions 4a, 4b at the bottoms of the trenches 21a, 21b, which makes avalanche current more likely to be drawn to the base bottom embedded region 5 when a high voltage is applied during reverse bias, thus making it possible to protect the gate insulating films 10a, 10b at the bottoms of the trenches 21a, 21b from high voltages during the reverse bias.

Figure 23:
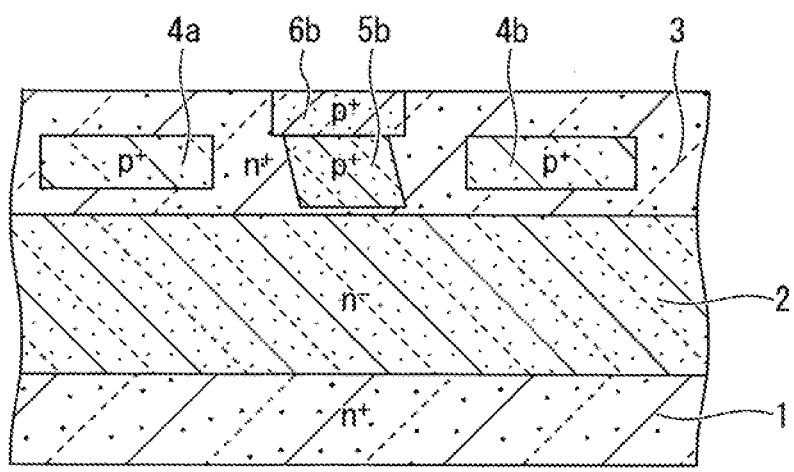
FIG. 23 is a cross-sectional view of a step for describing one example of a method of manufacturing the insulated gate semiconductor device in the first modification example.

As one example of the method of manufacturing the insulated gate semiconductor device in the first modification example, the n$^+$ current spreading layer 3 is formed as shown in FIG. 6, and then in order to form the first embedded region 5b, the ion beam is tilted relative to a line normal to the top surface of the current spreading layer 3 toward the off-angle direction as shown in FIG. 7, in order to select the channeling direction and perform multiple-stage ion implantation. Furthermore, in order to form the gate bottom protection regions 4a, 4b, multiple-stage ion implantation is performed from a direction perpendicular to the top surface of the current spreading layer 3 as shown in FIG. 8. Then, in order to form the second embedded region 6b, multiple-stage ion implantation is performed from a direction perpendicular to the top surface of the current spreading layer 3. In the ion implantation for forming the second embedded region 6b, the ion beam may be tilted relative to a line normal to the top surface of the current spreading layer 3 toward the off-angle direction, in order to select the channeling direction and perform multiple-stage ion implantation. Thereafter, a heat treatment is performed in order to form the gate bottom protection regions 4a, 4b, as shown in FIG. 23. At the same time, the base bottom embedded region (5b, 6b) made of the first embedded region 5b deeper than the gate bottom protection regions 4a, 4b and the second embedded regions 6b above the first embedded region 5b are formed.

Next, RIE etc. is used to form the trenches 21a, 21b shown in FIG. 22, and at the same time, the contact trench 22 is formed so as to go through the second embedded region 6b of the base bottom embedded region (5b, 6b) and so as to reach the first embedded region 5b. Thereafter, a metal film is deposited so as to fill in the contact trench 22, and the base contact plug 23 is formed by selectively removing the metal film. The other steps are the same as the method of manufacturing the insulated gate semiconductor device in the embodiment, and thus the description thereof will be omitted.

SECOND MODIFICATION EXAMPLE

Figure 24:
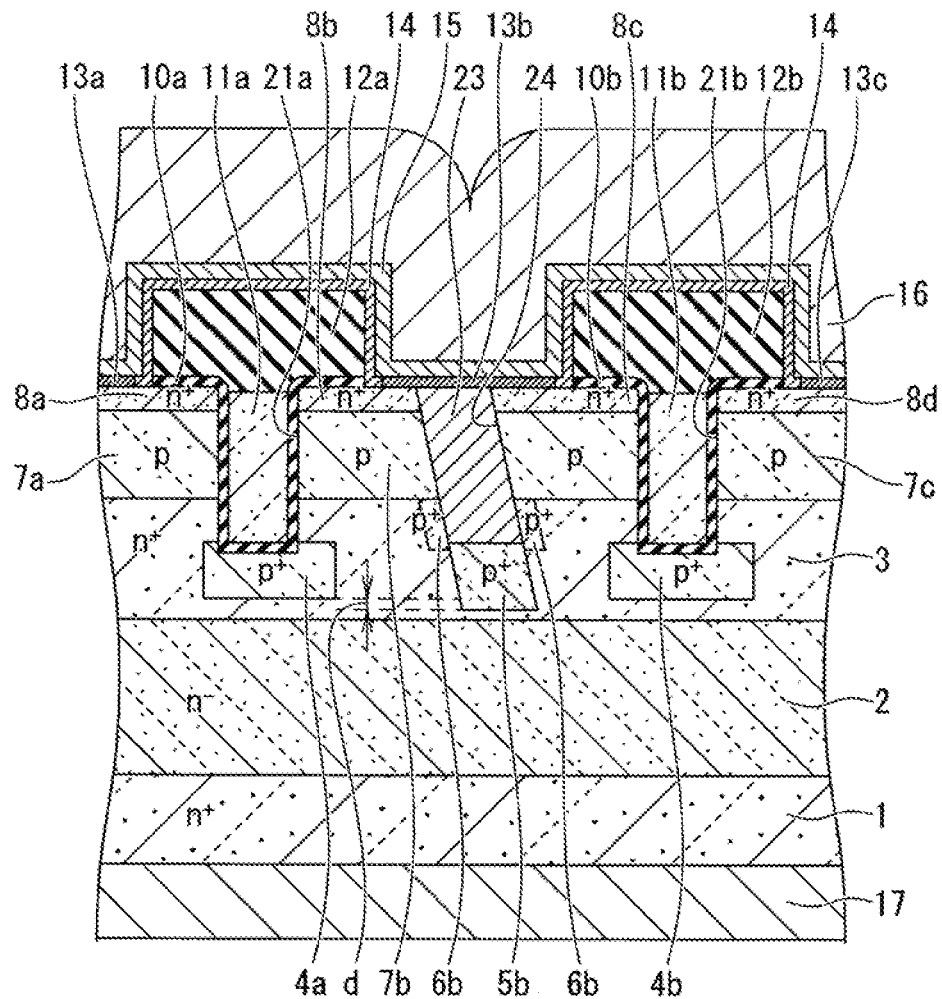
FIG. 24 is a cross-sectional view of main parts of one example of an insulated gate semiconductor device in a second modification example of the embodiment.

The insulated gate semiconductor device in the second modification example of the embodiment of the present invention differs from the insulated gate semiconductor device of the first modification example shown in FIG. 22 in that the base contact plug 23 is provided diagonally, as shown in FIG. 24. The base bottom embedded region (5b, 6b) is provided so as to cover the bottom of the base contact plug 23. The base bottom embedded region (5b, 6b) has the first embedded region 5b for contacting the bottom surface of the base contact plug 23 and the second embedded regions 6b disposed on the top surface of the first embedded region 5b.

The side surfaces of the base contact plug 23 are provided continuing in parallel to the oblique sides of the first embedded region 5b of the base bottom embedded region (5b, 6b). The side surfaces of the base contact plug 23 and the side surfaces of the first embedded regions 5b are tilted by selecting the channeling direction via tilting the ion beam relative to a line normal to the top surface of the current spreading layer 3 and drift layer 2 toward the off-angle direction. The side surfaces of the second embedded regions 6b on the sides opposite to the base contact plug 23 are illustratively shown as being parallel to the side surfaces of the base contact plug 23 and the side surfaces of the first embedded region 5b, but the side surfaces of the second embedded regions 6b on the sides opposite to the base contact plug 23 are not limited to this. For example, the side surfaces of the second embedded regions 6b on the sides opposite to the base contact plug 23 may be perpendicular to the top surface of the current spreading layer 3 and drift layer 2. The other configurations are the same as the insulated gate semiconductor device of the first modification example shown in FIG. 22, and thus redundant descriptions will be omitted.

In the insulated gate semiconductor device of the second modification example, the base bottom embedded region (5b, 6b) at the bottom of the contact trench 22 is provided with its bottom deeper than the gate bottom protection regions 4a, 4b at the bottom of the trenches 21a, 21b, which makes avalanche current more likely to be drawn to the base bottom embedded region (5b, 6b) when a high voltage is applied during reverse bias, thus making it possible to protect the gate insulating films 10a, 10b at the bottoms of the trenches 21a, 21b from high voltages during reverse bias.

Figure 25:
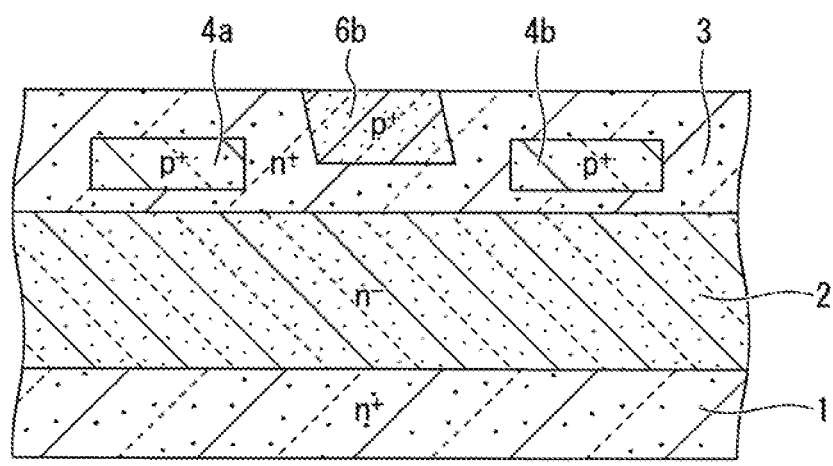
FIG. 25 is a cross-sectional view of a step for describing one example of a method of manufacturing the insulated gate semiconductor device in the second modification example.

As one example of the method of manufacturing the insulated gate semiconductor device in the second modification example, p-type impurity ions are implanted via multiple-stage ion implantation in a direction perpendicular to the top surface of the current spreading layer 3 in order to form the gate bottom protection regions 4a, 4b. Furthermore, in order to form the second embedded regions 6b, p-type impurity ions are implanted via multiple-stage ion implantation in a channeling direction tilted relative to a line normal to the top surface of the current spreading layer 3 toward the off-angle direction. Thereafter, a heat treatment is performed in order to form the p+ gate bottom protection regions 4a, 4b and second embedded regions 6b as shown in FIG. 25.

Figure 26:
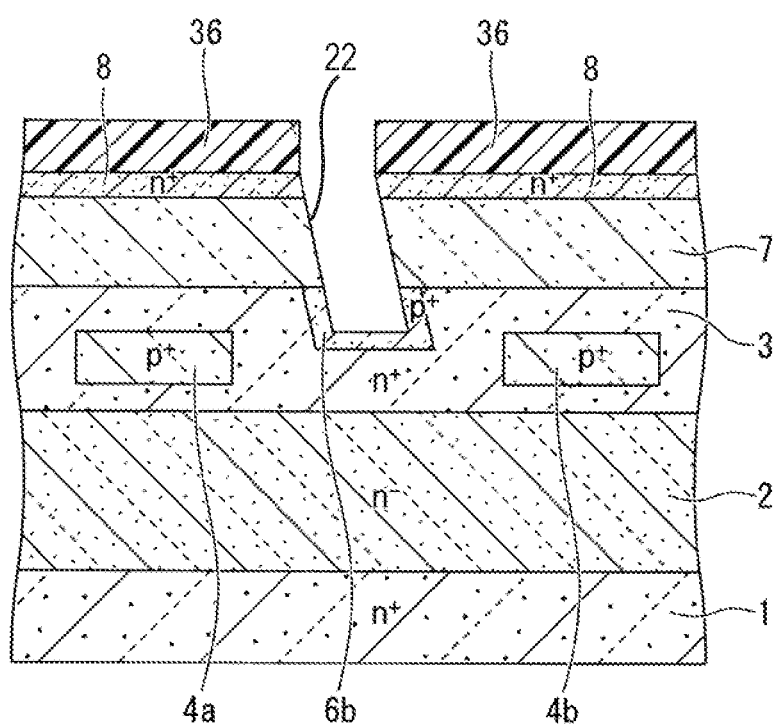
FIG. 26 is a cross-sectional view of a step following the step of FIG. 25 for describing one example of the method of manufacturing the insulated gate semiconductor device in the second modification example.

Then, as shown in FIG. 26, the contact trench 22 is formed so as to have side walls along the channeling direction during ion implantation when forming the first embedded region 5b. Next, multiple-stage ion implantation of p-type impurity ions is performed in the bottom surface of the contact trench 22 with the ion beam in the direction parallel to the side walls of the contact trench 22, or in other words, in a channeling direction in which the ion beam is tilted relative to a line normal to the top surface of the current spreading layer 3 toward the off-angle direction. Thereafter, a heat treatment is performed in order to form the first embedded region 5b deeper than the gate bottom protection regions 4a, 4b. Next, evaporation or sputtering etc. is used to deposit a metal film or the like, and etch-back is performed on the metal film in order to embed the base contact plug 23 in the contact trench 22. The other steps are the same as the method of manufacturing the insulated gate semiconductor device in the embodiment, and thus the description thereof will be omitted.

When forming the first embedded region 5b and gate bottom protection regions 4a, 4b, the p-type impurities may be implanted all at once via multiple-stage ion implantation instead of being individually implanted via multiple-stage ion implantation. In other words, after forming of the trenches 21a, 21b having parallel side walls in the depth direction and the contact trench 22 having side walls tilted relative to the depth direction, the p-type impurity ions may be implanted at the same time via multiple-stage ion implantation in the bottom of the trenches 21a, 21b and in the bottom of the contact trench 22 in the direction parallel to the side walls of the contact trench 22. Thereafter, a heat treatment is performed in order to form the gate bottom protection regions 4a, 4b, and it is possible to form the base bottom embedded region 5b deeper than the gate bottom protection regions 4a, 4b.

Other Embodiments

The present invention was described using the embodiment and modification examples above, but the descriptions and drawings forming a part of the disclosure should not be construed as limiting the present invention. Various substitute embodiments, examples, and applied techniques should be clear to a person skilled in the art based on this disclosure.

Figure 27:
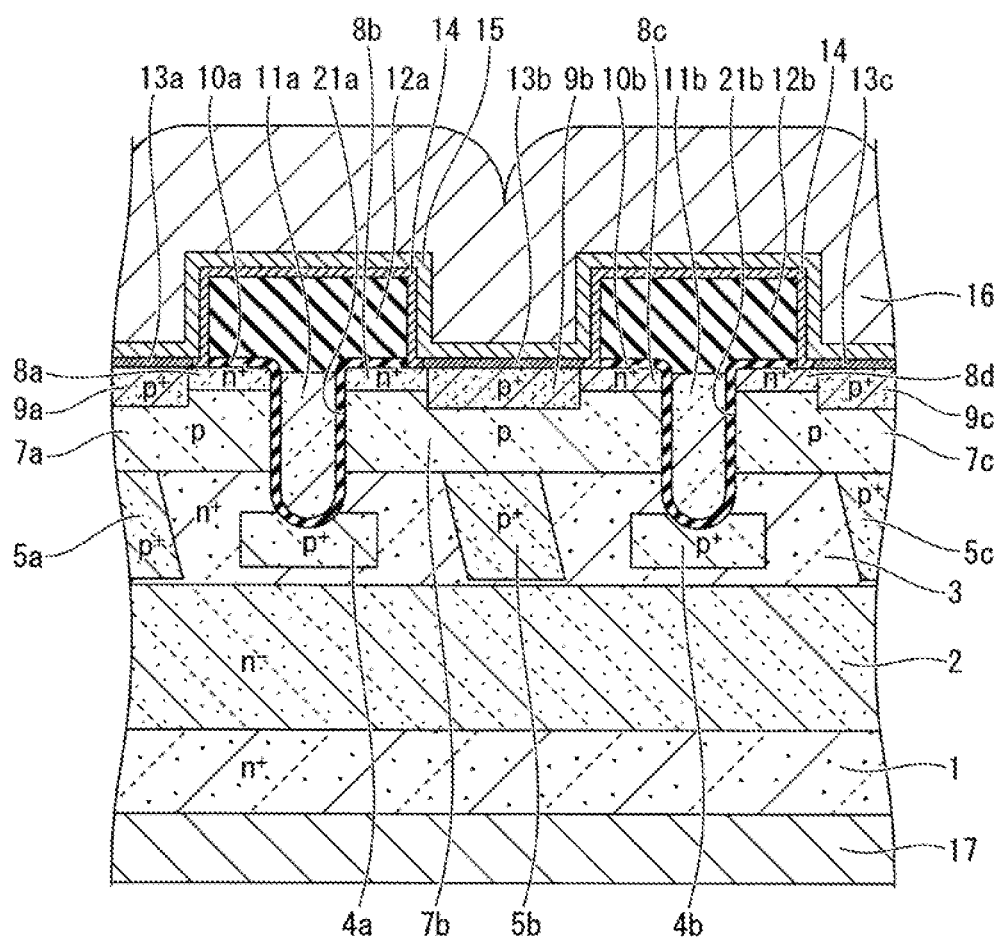
FIG. 27 is a cross-sectional view of main parts of one example of an insulated gate semiconductor device in another embodiment of the present invention.

In the embodiment, as shown in FIG. 1A, an example was shown in which the p+ base bottom embedded regions (5a, 6a), (5b, 6b), (5c, 6c) have a two-layer structure of the first embedded regions 5a, 5b, 5c and second embedded regions 6a, 6b, 6c, but as shown in FIG. 27, a single layer of the p+ base bottom embedded regions 5a, 5b, 5c may be provided. In ion implantation when forming the base bottom embedded regions 5a, 5b, 5c, the acceleration voltage, dose amount, and implantation rounds etc. may be adjusted to make the base bottom embedded regions 5a, 5b, 5c thick in the depth direction.

In the embodiment, a MISFET having a trench structure was shown as an example, but the present invention is not limited to this and can be applied to an insulated gate semiconductor device having various types of trench structures such as an IGBT with a trench structure. As a trench gate IGBT, the n+ source regions 8a, 8b, 8c, 8d of the MISFET shown in FIG. 1A may be emitter regions, and a p+ collector region may be provided on the bottom surface side of the drift layer 2 instead of the n+ drain region 1.

In the embodiment of the present invention, an example was shown in which the insulated gate semiconductor device uses SiC, but the present invention can be applied to insulated gate semiconductor devices using other wide bandgap semiconductors, such as gallium nitride (GaN) or diamond. Furthermore, the present invention is not limited to wide bandgap semiconductors and can also be applied to insulated gate semiconductor devices using silicon (Si).

Moreover, SiC has many polytypes (polyforms), such as cubic 3C-SiC, hexagonal 4H-SiC, 6H-SiC, etc., but the channeling direction is merely selected for each so as to cause channeling to occur.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of manufacturing an insulated gate semiconductor device, the method comprising:
    forming a drift layer of a first conductivity type made of a semiconductor material having a wider bandgap than silicon, a top surface of the semiconductor material having an off-angle;
    forming a gate bottom protection region of a second conductivity type inside the drift layer by performing ion implantation in a direction perpendicular to a top surface of the drift layer;
    forming a base bottom embedded region of the second conductivity type inside the drift layer by performing ion implantation in a prescribed titled direction in which channeling of implanted impurities occurs in a direction that is tilted relative to a line normal to the top surface of the drift layer towards a direction of the off-angle, the base bottom embedded region being formed such that a position of the bottom surface of the base bottom embedded region being deeper than the gate bottom protection region in the drift layer;
    forming a base region of the second conductivity type made of said semiconductor material above the drift layer;
    forming a first high-impurity region of the first conductivity type in a top of the base region at a higher impurity density than the drift layer;
    forming a base contact region of the second conductivity type in the top of the base region above the base bottom embedded region;
    forming a trench penetrating the base region and reaching the gate bottom protection region;
    forming a gate insulating film on side walls and a bottom surface of the trench; and
    forming an embedded gate electrode in the trench, with the gate insulating film interposed between the trench and the embedded gate electrode.

2. The method of manufacturing the insulated gate semiconductor device according to claim 1, wherein the prescribed titled direction is within ±3° measured in the direction of the off-angle relative to the c-axis direction of a crystal forming the drift layer.

3. The method of manufacturing the insulated gate semiconductor device according to claim 1, wherein the bottom surface of the base bottom embedded region is at least 0.1 µm deeper than the bottom surface of the gate bottom protection region.

4. The method of manufacturing the insulated gate semiconductor device according to claim 1, wherein the forming of the base bottom embedded region includes:
    performing a first ion implantation in the prescribed titled direction to form a first embedded region; and
    performing a second ion implantation in the prescribed titled direction at a smaller acceleration voltage than the first ion implantation so as to form a second embedded region over the first embedded region.

5. The method of manufacturing the insulated gate semiconductor device according to claim 1, further comprising:
    forming a contact trench penetrating the first high-impurity region and the base region and reaching and in contact with the base bottom embedded region; and
    forming a base contact plug embedded in the contact trench.

6. The method of manufacturing the insulated gate semiconductor device according to claim 5,
    wherein the contract trench is formed so as to have side walls along the prescribed titled direction, and
    wherein the base bottom embedded region is formed below a bottom of the contact trench by performing ion implantation in a parallel direction of the side walls.

7. The method of manufacturing the insulated gate semiconductor device according to claim 1, wherein said semiconductor material is silicon carbide.

8. The method of manufacturing the insulated gate semiconductor device according to claim 1, wherein the off-angle is 4° to 8°.

9. The method of manufacturing the insulated gate semiconductor device according to claim 1, further comprising:
    forming a current spreading layer of the first conductivity type in an upper layer of the drift layer, the current spreading layer having a higher impurity concentration than a rest of the drift layer,
    wherein the gate bottom protection region and the base bottom embedded region are both embedded in the current spreading layer in the drift layer.

10. The method of manufacturing the insulated gate semiconductor device according to claim 1, wherein the off-angle is greater than 3° and less than or equal to 8°, and an angle formed by the tilted direction and the line normal to the top surface of the drift layer is nonzero and within ±3° of the off-angle.

* * * * *